US011956990B2

(12) United States Patent
Lee et al.

(10) Patent No.: US 11,956,990 B2
(45) Date of Patent: Apr. 9, 2024

(54) DISPLAY DEVICE WITH METAL TIP PROTRUDING TOWARD GROOVE CENTER

(71) Applicant: SAMSUNG DISPLAY CO., LTD., Yongin-si (KR)

(72) Inventors: Jeongho Lee, Yongin-si (KR); Minju Kim, Yongin-si (KR); Wonho Kim, Yongin-si (KR); Keunsoo Lee, Yongin-si (KR); Kyungchan Chae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/862,313

(22) Filed: Jul. 11, 2022

(65) Prior Publication Data

US 2022/0344621 A1    Oct. 27, 2022

Related U.S. Application Data

(63) Continuation of application No. 16/738,809, filed on Jan. 9, 2020, now Pat. No. 11,387,432.

(30) Foreign Application Priority Data

Mar. 21, 2019  (KR) .................. 10-2019-0032539

(51) Int. Cl.
*H10K 50/844* (2023.01)
*H10K 59/124* (2023.01)
*H10K 77/10* (2023.01)

(52) U.S. Cl.
CPC ......... *H10K 50/844* (2023.02); *H10K 59/124* (2023.02); *H10K 77/10* (2023.02)

(58) Field of Classification Search
CPC ..... H10K 50/844; H10K 77/10; H10K 59/124
See application file for complete search history.

(56) References Cited

U.S. PATENT DOCUMENTS

| 9,905,629 B2 | 2/2018 | Kim et al. |
| 10,135,010 B2 | 11/2018 | Kim et al. |
| 10,135,025 B2 | 11/2018 | Kim et al. |
| 10,199,448 B2 | 2/2019 | Kim et al. |

(Continued)

FOREIGN PATENT DOCUMENTS

| KR | 10-2017-0045459 A | 4/2017 |
| KR | 10-2017-0096646 A | 8/2017 |

(Continued)

*Primary Examiner* — Lex H Malsawma
(74) *Attorney, Agent, or Firm* — Lewis Roca Rothgerber Christie LLP

(57) ABSTRACT

A display panel includes: a substrate comprising a first area, a second area, and a third area between the first area and the second area; a stack structure in the second area and comprising a pixel electrode, an opposite electrode, and an intermediate layer between the pixel electrode and the opposite electrode; a groove in the third area and separating at least one organic material layer included in the intermediate layer; and at least one metal layer in the third area and comprising a first opening overlapping the groove, wherein the groove is defined in a multi-layered film including an organic layer and an inorganic layer on the organic layer, and the at least one metal layer is between the substrate and the multi-layered film.

19 Claims, 20 Drawing Sheets

(56) References Cited

U.S. PATENT DOCUMENTS

| | | |
|---|---|---|
| 2017/0148856 A1 | 5/2017 | Choi et al. |
| 2018/0157362 A1 | 6/2018 | Kim et al. |
| 2019/0081273 A1* | 3/2019 | Sung .................... H10K 50/80 |
| 2019/0131378 A1 | 5/2019 | Sung et al. |
| 2019/0148672 A1 | 5/2019 | Seo et al. |
| 2019/0245159 A1 | 8/2019 | Kim et al. |

FOREIGN PATENT DOCUMENTS

| | | |
|---|---|---|
| KR | 10-2017-0115177 A | 10/2017 |
| KR | 10-2018-0002126 A | 1/2018 |
| KR | 10-2018-0063633 A | 6/2018 |

* cited by examiner

DISPLAY DEVICE WITH METAL TIP PROTRUDING TOWARD GROOVE CENTER

CROSS-REFERENCE TO RELATED APPLICATIONS

This application is a continuation of U.S. patent application Ser. No. 16/738,809, filed Jan. 9, 2020, which claims priority to and the benefit of Korean Patent Application No. 10-2019-0032539, filed Mar. 21, 2019, the entire content of both of which is incorporated herein by reference.

BACKGROUND

1. Field

Aspects of one or more example embodiments relate to a display panel including a first area within a display area.

2. Description of the Related Art

In recent years, the uses and applications of display devices has diversified. In addition, display devices are becoming thinner and more lightweight, and thus the range of use thereof is widening.

As the display area of display devices is increasing, various functions connected or linked to a display device may be added to the display device. As a method of adding various functions while increasing the display area, a display device may include various components arranged in the display area.

The above information disclosed in this Background section is only for enhancement of understanding of the background and therefore the information discussed in this Background section does not necessarily constitute prior art.

SUMMARY

One or more example embodiments may include a display panel including a first area in which various types of components may be arranged in a display area, and a display device including the display panel. However, the above is merely an example, and embodiments according to the present disclosure are not limited thereto.

According to some example embodiments, a display panel includes: a substrate including a first area, a second area, and a third area between the first area and the second area; a stack structure located in the second area and including a pixel electrode, an opposite electrode, and an intermediate layer between the pixel electrode and the opposite electrode; a groove located in the third area and separating at least one organic material layer included in the intermediate layer; and a metal layer located in the third area and including a first opening overlapping the groove.

According to some example embodiments, the groove may be defined in a multi-layered film including an organic layer and an inorganic layer on the organic layer, and the at least one metal layer may be arranged between the substrate and the multi-layered film.

According to some example embodiments, the inorganic layer of the multi-layered film may include a pair of tips protruding toward a center of the groove.

According to some example embodiments, the organic layer of the multi-layered film may include an opening, and the inorganic layer of the multi-layered film may be in direct contact with the at least one metal layer through the opening of the organic layer.

According to some example embodiments, the inorganic layer of the multi-layered film may include a metal layer.

According to some example embodiments, the display panel may further include at least one inorganic insulating layer that is between the substrate and the multi-layered film and includes a second opening overlapping the groove and the first opening.

According to some example embodiments, the display panel may further include a transistor and a storage capacitor that are in the second area and electrically connected to the stack structure, wherein the at least one metal layer includes a same material as at least one of a gate electrode of the transistor or electrodes of the storage capacitor.

According to some example embodiments, a width of the first opening of the at least one metal layer is greater than a width of the groove.

According to some example embodiments, the at least one metal layer may have a ring shape surrounding the first area when viewed in a direction perpendicular to an upper surface of the substrate.

According to some example embodiments, the display panel may further include a lower metal layer between the substrate and the multi-layered film.

According to some example embodiments, a bottom surface of the groove may be at a same level as an upper surface of the lower metal layer.

According to some example embodiments, the lower metal layer may include a third opening corresponding to the groove.

According to some example embodiments, the display panel may include a hole located in the first area and passing through the display panel.

According to some example embodiments, a display panel includes: a substrate including an opening area, a display area, and a middle area between the opening area and the display area; a transistor arranged in the display area; a display element including a pixel electrode electrically connected to the transistor, an intermediate layer on the pixel electrode, and an opposite electrode on the intermediate layer; a first organic insulating layer between the transistor and the pixel electrode, the first organic insulating layer extending to the middle area; a groove located in the middle area and having an undercut structure, the groove separating at least one organic material layer included in the intermediate layer; and an inorganic structure that is between the substrate and the first organic insulating layer and has a first opening corresponding to the groove.

According to some example embodiments, the groove may be defined in a multi-layered film, and the multi-layered film may include a first organic insulating layer located on the substrate and an inorganic layer located on the first organic insulating layer, and the inorganic layer may include a pair of tips extending toward a center of the groove.

According to some example embodiments, the inorganic layer may include a metal.

According to some example embodiments, a width of a portion of the groove passing the first organic insulating layer may be greater than a width of the first opening.

According to some example embodiments, the inorganic structure may include at least one inorganic insulating layer and at least one metal layer.

According to some example embodiments, the at least one metal layer may include a second opening that corresponds to the first opening of the inorganic structure and is larger than the first opening of the inorganic structure.

According to some example embodiments, the display panel may further include a lower metal layer between the substrate and the inorganic structure.

According to some example embodiments, a bottom surface of the groove may be at a same level as an upper surface of the lower metal layer.

According to some example embodiments, the lower metal layer may include a third opening overlapping the groove.

According to some example embodiments, the display panel may further include an inorganic contact area arranged adjacent to the groove.

According to some example embodiments, the display panel may further include a metal layer arranged on the first organic insulating layer, and the metal layer may directly contact the inorganic structure through an opening of the first organic insulating layer to provide the inorganic contact area.

According to some example embodiments, the inorganic contact area may be arranged on each of both sides of the groove, with the groove therebetween.

According to some example embodiments, a depth of the groove may be greater than a maximum thickness of a portion of the first organic insulating layer located in the display area.

In addition to the aforesaid details, other aspects, features, and characteristics will be clarified from the following drawings, claims, and detailed description.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
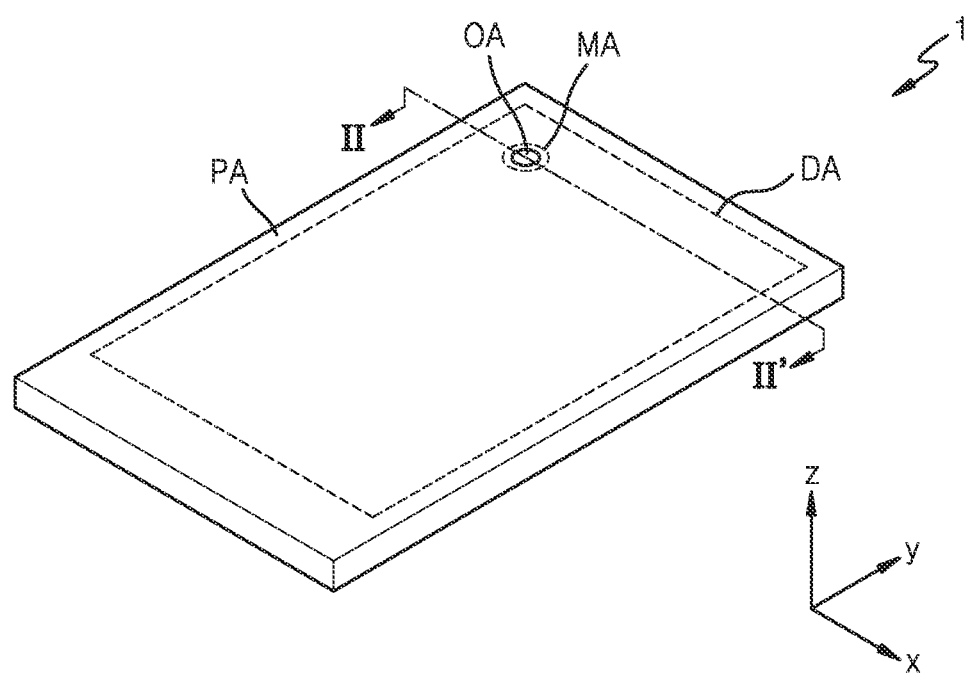
FIG. 1 is a perspective view schematically illustrating a display device according to some example embodiments.

Reference will now be made in more detail to example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Because embodiments according to the present disclosure may have various modifications and several embodiments, example embodiments are shown in the drawings and will be described in more detail. Effects, features, and a method of achieving the same will be specified with reference to the embodiments described below in detail together with the attached drawings. However, the embodiments may have different forms and should not be construed as being limited to the descriptions set forth herein.

Hereinafter, aspects of some example embodiments of the present disclosure will be described more fully with reference to the accompanying drawings, in which example embodiments according to the present disclosure are shown. In the drawings, like elements are labeled like reference numerals and repeated description thereof will be omitted.

While such terms as "first," "second," etc., may be used to describe various components, such components must not be limited to the above terms. The above terms are used only to distinguish one component from another.

An expression used in the singular encompasses the expression of the plural, unless it has a clearly different meaning in the context.

In the present specification, it is to be understood that the terms such as "including" or "having" are intended to indicate the existence of the features or components disclosed in the specification, and are not intended to preclude the possibility that one or more other features or components may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

Throughout the disclosure, the expression "A and/or B" indicates only A, only B, or both A and B. Also, the expression "at least one of A and B" indicates only A, only B, or both A and B.

In the embodiments below, when a layer, an area, or an element is "connected", it may be construed that the layer, area, or element is connected directly or/and indirectly through other constituent elements therebetween. For example, when a layer, an area, an element, or the like is described as being electrically connected, the layer, the area, the element, or the like may be directly electrically connected and/or indirectly through another layer, area, element, or the like therebetween.

FIG. 1 is a perspective view schematically illustrating a display device according to some example embodiments.

Figure 2:
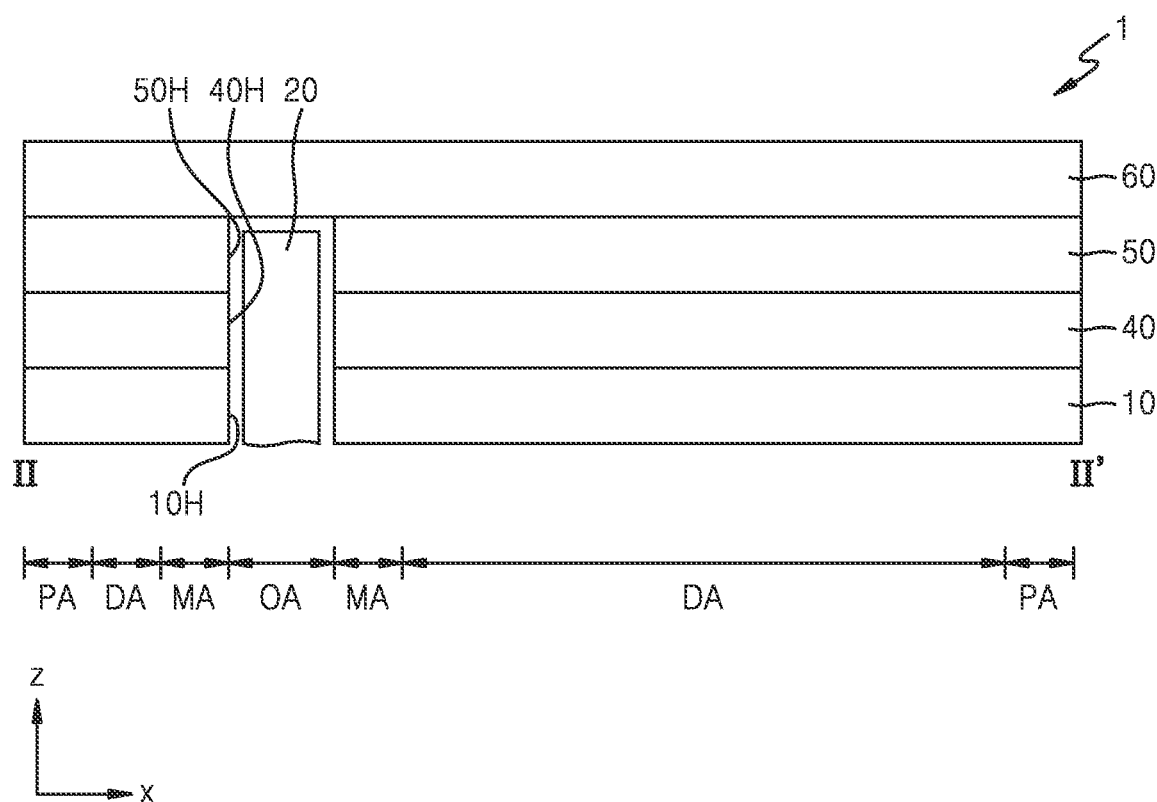
FIG. 2 is a cross-sectional view schematically illustrating a display device according to some example embodiments.

Referring to FIG. 1, a display device 1 includes a first area OA and a display area DA, which is a second area that partially surrounds the first area OA. The display device 1 may provide or display an image by using light emitted from a plurality of pixels arranged in the display area DA. The first area OA may be completely surrounded by the display area DA. The first area OA may be an area where a component to be described with reference to FIG. 2 is arranged.

A middle area MA is positioned as a third area between the first area OA and the display area DA, which is a second area. The display area DA may be surrounded by a peripheral area PA, which is a fourth area. The middle area MA and the peripheral area PA may be a type of non-display area where no pixels are arranged. The middle area MA may be completely surrounded by the display area DA, and the display area DA may be completely surrounded by the peripheral area PA.

Hereinafter, an organic light-emitting display device will be described as an example of the display device 1 according to some example embodiments, but the display device according to embodiments of the present disclosure is not limited thereto. According to some example embodiments, the display device 1 may be, for example, an inorganic light-emitting display (or inorganic EL display) or a quantum dot light-emitting display. For example, an emissive layer of a display element included in the display device 1 may include an organic material, an inorganic material, quantum dots, or both an organic material and quantum dots or both an inorganic material and quantum dots.

While FIG. 1 illustrates one first area OA, which is approximately circular, the embodiments are not limited thereto. Two or more first areas OA may be included, and the shape thereof may be various, for example, a circle, an oval, a star shape, a diamond shape, or the like.

Figure 3:
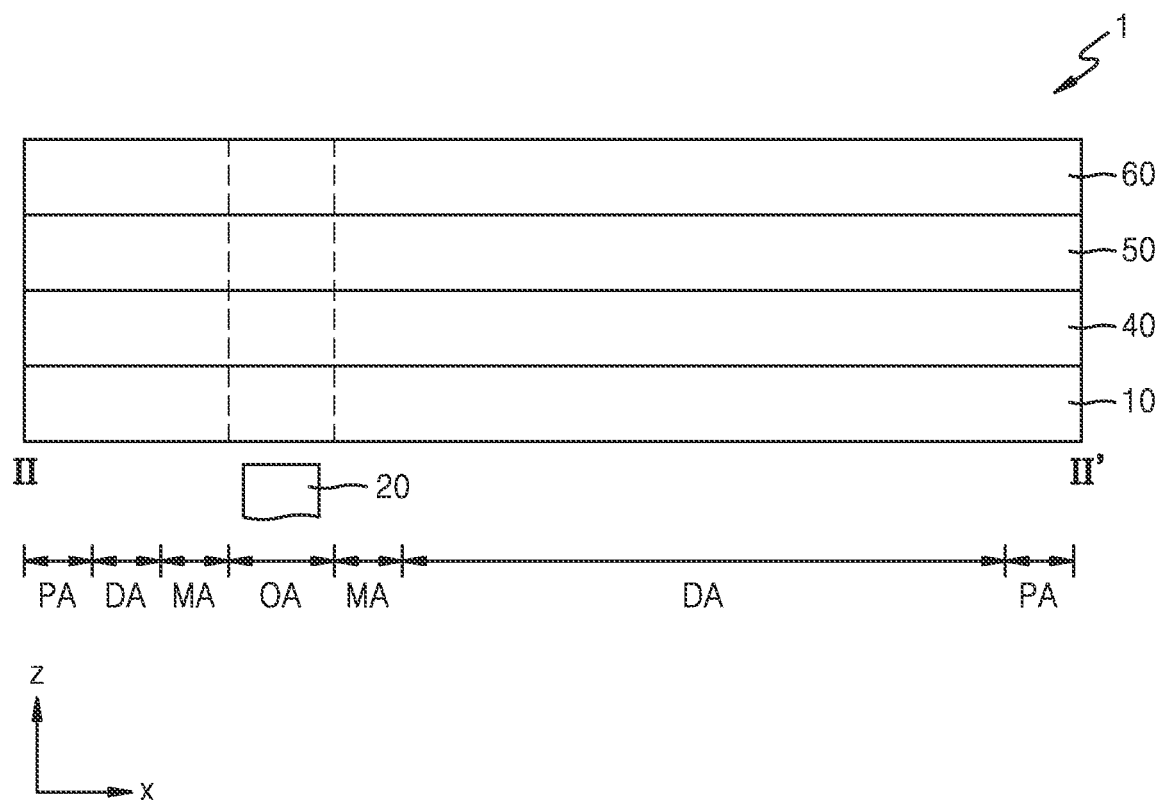
FIG. 3 is a cross-sectional view schematically illustrating a display device according to some example embodiments.

FIG. 2 is a schematic cross-sectional view illustrating a display device 1 according to some example embodiments, and may correspond to a cross-section cut along line II-II' of FIG. 1. FIG. 3 corresponds to a modified embodiment of the display device 1 of FIG. 2.

Referring to FIG. 2, the display device 1 may include a display panel 10, an input sensing layer 40 arranged on the display panel 10, and an optical functional layer 50, which may be covered by a window 60. The display device 1 may be various types of electronic devices such as a mobile phone, a laptop computer, or a smartwatch.

The display panel 10 may display an image. The display panel 10 includes pixels arranged in the display area DA. The pixels may include a display element and a pixel circuit connected to the display element.

The input sensing layer 40 acquires coordinate information according to an external input such as a touch event. The input sensing layer 40 may include a sensing electrode (or touch electrode) and a trace line connected to the sensing electrode. The input sensing layer 40 may be arranged on the display panel 10. The input sensing layer 40 may sense an external input by using a mutual cap method or/and a self-cap method.

The input sensing layer 40 may be formed directly on the display panel 10 or may be separately formed and then combined to the display panel 10 by using an adhesive layer such as an optical clear adhesive. For example, the input sensing layer 40 may be formed continuously after a process of forming the display panel 10, and in this case, the input sensing layer 40 may be regarded as a portion of the display panel 10, and no adhesive layer may be present between the input sensing layer 40 and the display panel 10. In FIG. 2, the input sensing layer 40 positioned between the display panel 10 and the optical functional layer 50 is illustrated. However, according to some example embodiments, the input sensing layer 40 may also be arranged on the optical functional layer 50.

The optical functional layer 50 may include an anti-reflection layer. The anti-reflection layer may reduce a reflectivity of light incident from the outside onto the display panel 10 through the window 60 (external light). The anti-reflection layer may include a retarder and a polarizer. The retarder may be a film type or a liquid coating type and may include a λ/2 retarder or a λ/4 retarder. The polarizer may also be a film type or a liquid coating type, and a film-type polarizer may include a stretchable synthetic resin film, and the liquid coating type polarizer may include liquid crystals arranged in a certain arrangement. The retarder and the polarizer may further include a protective film.

According to some example embodiments, the anti-reflection layer may include a black matrix and color filters. The color filters may be arranged by considering colors of light respectively emitted from the pixels of the display panel 10. The color filters may respectively include pigments or dyes of red, green or blue colors. Alternatively, the color filters may respectively further include quantum dots in addition to the above-described pigments or dyes. Alternatively, some of the color filters may not include the above-described pigments or dyes, but may include scattered particles such as titanium oxide.

According to some example embodiments, the anti-reflection layer may include a destructive interference structure. The destructive interference structure may include a first reflective layer and a second reflective layer arranged on different layers. First reflected light and second reflected light respectively reflected by the first reflective layer and the second reflective layer may undergo destructive interference, thus reducing reflectivity of external light.

The optical functional layer 50 may include a lens layer. The lens layer may increase an output efficiency of light emitted from the display panel 10 or may reduce color deviation. The lens layer may include a layer having a concave or convex lens shape or/and a plurality of layers having different refractive indices. The optical functional layer 50 may include both the anti-reflection layer and the lens layer described above or one of them.

According to some example embodiments, the optical functional layer 50 may be continuously formed after a process of forming the display panel 10 and/or the input sensing layer 40. In this case, no adhesive layer may be arranged between the optical functional layer 50 and the display panel 10 or between the optical functional layer 50 and the input sensing layer 40.

The display panel 10, the input sensing layer 40, and/or the optical functional layer 50 may include a through hole. As illustrated in FIG. 2, the display panel 10, the input sensing layer 40, and the optical functional layer 50 may respectively include through holes 10H, 40H, and 50H, and the through holes 10H, 40H, and 50H may overlap each other. The through holes 10H, 40H, and 50H are located to correspond to the first area OA. The first area OA may be a type of component area in which a component 20 included to add various functions to the display device 1 as described above is located (for example, a sensor area, a camera area, a speaker area, etc.).

The component 20 may be located in the through holes 10H, 40H, and 50H, as illustrated in FIG. 2. The component 20 may include an electronic element. For example, the component 20 may be an electronic element that uses light or sound. For example, the electronic element may include a sensor that outputs or/and receives light, such as an infrared sensor, a camera receiving light to capture an image, a sensor measuring a distance or sensing a fingerprint by outputting or sensing light or sound, a compact lamp outputting light, a speaker outputting sound, and the like. An electronic element using light may use light of various wavelength bands such as visible light, infrared light, and ultraviolet light. In some embodiments, the first area OA may be a transmission area through which light or/and sound that are output from the component 20 to the outside or that travel from the outside into the component 20.

FIG. 2 illustrates that the display panel 10, the input sensing layer 40, and the optical functional layer 50 respectively include the through holes 10H, 40H, and 50H, but the embodiments are not limited thereto.

According to another embodiment, one or more of the display panel 10, the input sensing layer 40, and the optical functional layer 50 may not include a through hole. For example, any one or two selected from among the display panel 10, the input sensing layer 40, and the optical functional layer 50 may not include a through hole. Alternatively, the display panel 10, the input sensing layer 40, and the optical functional layer 50 may not include a through hole as illustrated in FIG. 3. In this case, the component 20 may be arranged below the display panel 10 as illustrated in FIG. 3.

According to some example embodiments, when the display device 1 is used as smartwatch or a dash board for vehicles, the component 20 may be a hand of a watch or a member such as a hand indicating certain information (for example, vehicle velocity). When the display device 1 includes a hand of a watch or a dashboard for vehicles, the component 20 may pass through the window 60 and be exposed to the outside, and the window 60 may have a through hole corresponding to the first area OA.

The component 20 may include component(s) related to the function of the display panel 10 as described above or a component such as accessories that increase the aesthetic sense of the display panel 10. Although not illustrated in FIGS. 2 and 3, a layer that includes an optical transparent adhesive may be between the window 60 and the optical functional layer 50.

FIGS. 4A through 4D are schematic cross-sectional views of a display panel 10 according to an embodiment.

Figure 4A:
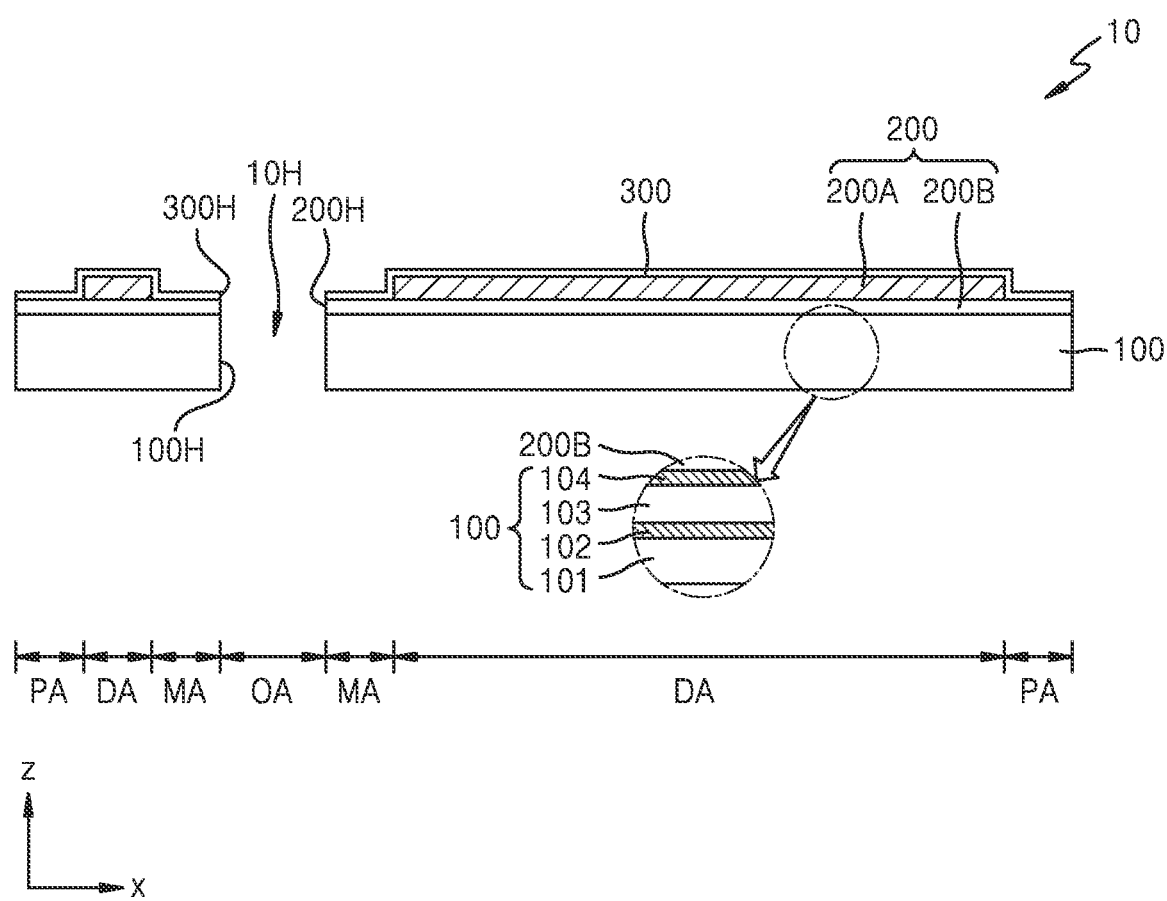
FIGS. 4A through 4D are schematic cross-sectional views of a display panel according to some example embodiments.

Referring to FIG. 4A, the display panel 10 includes a display layer 200 arranged on a substrate 100. The substrate 100 may include a glass material or a polymer resin. The substrate 100 may be a multi-layer. For example, the substrate 100 may include, as shown in the enlarged view of FIG. 4A, a first base layer 101, a first barrier layer 102, a second base layer 103, and a second barrier layer 104.

The first and second base layers 101 and 103 may each include a polymer resin. For example, the first base layer 101 and the second base layer 103 may include a polymer resin such as polyethersulfone (PES), polyarylate (PAR), polyetherimide (PEI), polyethylene naphthalate (PEN), polyethyleneterephthalate (PET), polyphenylene sulfide (PPS), polyimide (PI), polycarbonate (PC), cellulose triacetate (TAC), or cellulose acetate propionate (CAP). The polymer may be transparent.

The first barrier layer 102 and the second barrier layer 104 are barrier layers preventing penetration of external foreign substances and may be a single layer structure or a multi-layer structure including an inorganic material such as silicon nitride ($SiN_x$) or silicon oxide ($SiO_x$).

The display layer 200 includes a plurality of pixels. The display layer 200 may include a display element layer 200A including display elements arranged in each pixel and a pixel circuit layer 200B including a pixel circuit and insulating layers arranged in each pixel. The display element layer 200A may have a pixel electrode, an opposite electrode, and a stacked structure between the pixel electrode and the opposite electrode, and each display element may be an organic light-emitting diode (OLED). Each pixel circuit may include a thin film transistor and a storage capacitor.

Display elements of the display layer 200 may be covered by an encapsulation member such as a thin film encapsulation layer 300, and the thin film encapsulation layer 300 may include at least one inorganic encapsulation layer and at least one organic encapsulation layer. As the display panel 10 includes the substrate 100 including a polymer resin and the thin film encapsulation layer 300 including an inorganic encapsulation layer and an organic encapsulation layer, the flexibility of the display panel 10 may be increased.

The display panel 10 may include a through hole 10H passing through the display panel 10. The through hole 10H may be located in the first area OA, and the first area OA in this case may be a type of a hole area. In FIG. 4A, the substrate 100 and the thin film encapsulation layer 300 respectively include through holes 100H and 300H corresponding to the through hole 10H of the display panel 10. The display layer 200 may also include a through hole 200H corresponding to the first area OA.

Figure 4B:
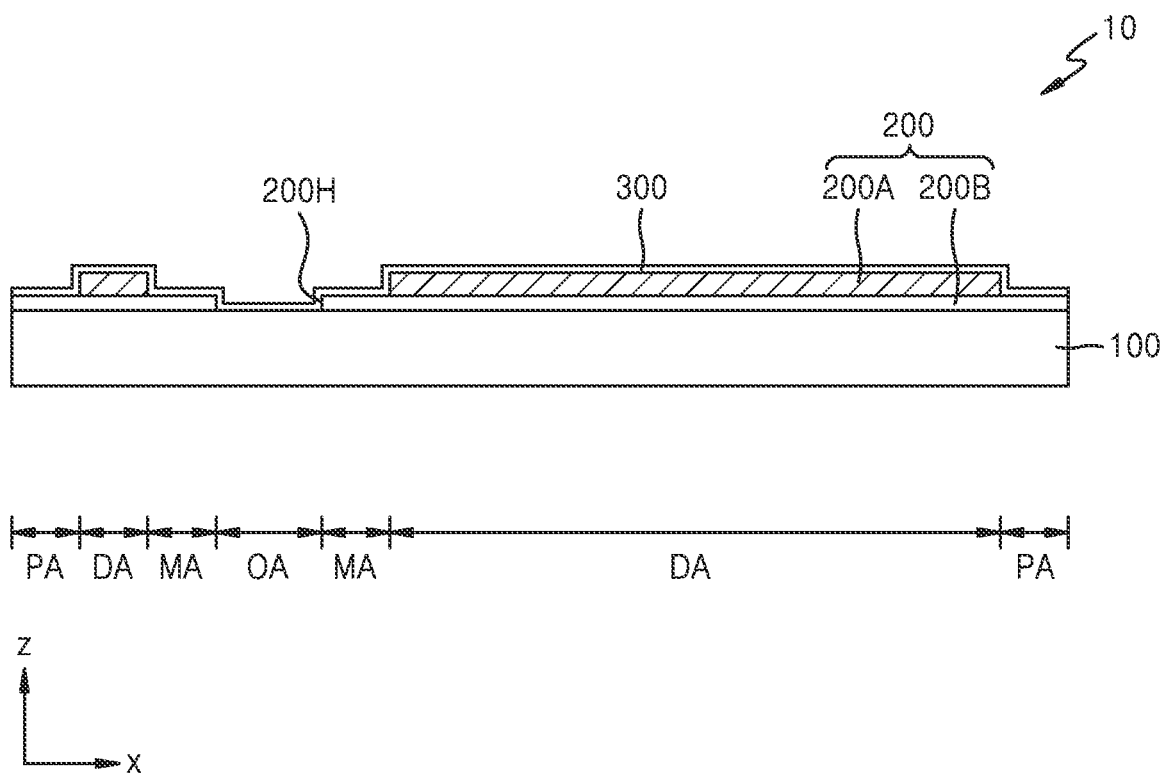

According to some example embodiments, as illustrated in FIG. 4B, the substrate 100 may not include a through hole corresponding to the first area OA. The display layer 200 may include a through hole 200H corresponding to the first area OA. The thin film encapsulation layer 300 may not include a through hole corresponding to the first area OA. According to some example embodiments, as illustrated in FIG. 4C, the display layer 200 may not include the through hole 200H corresponding to the first area OA.

Figure 4C:
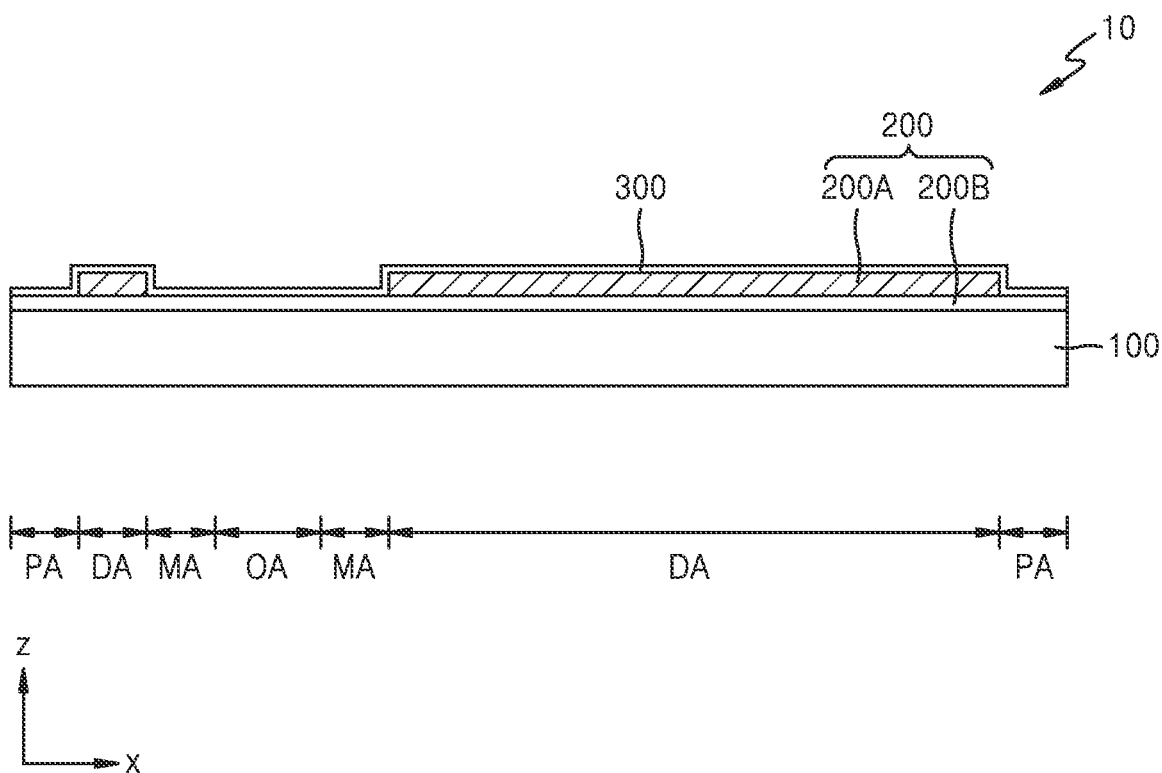
Figure 4D:
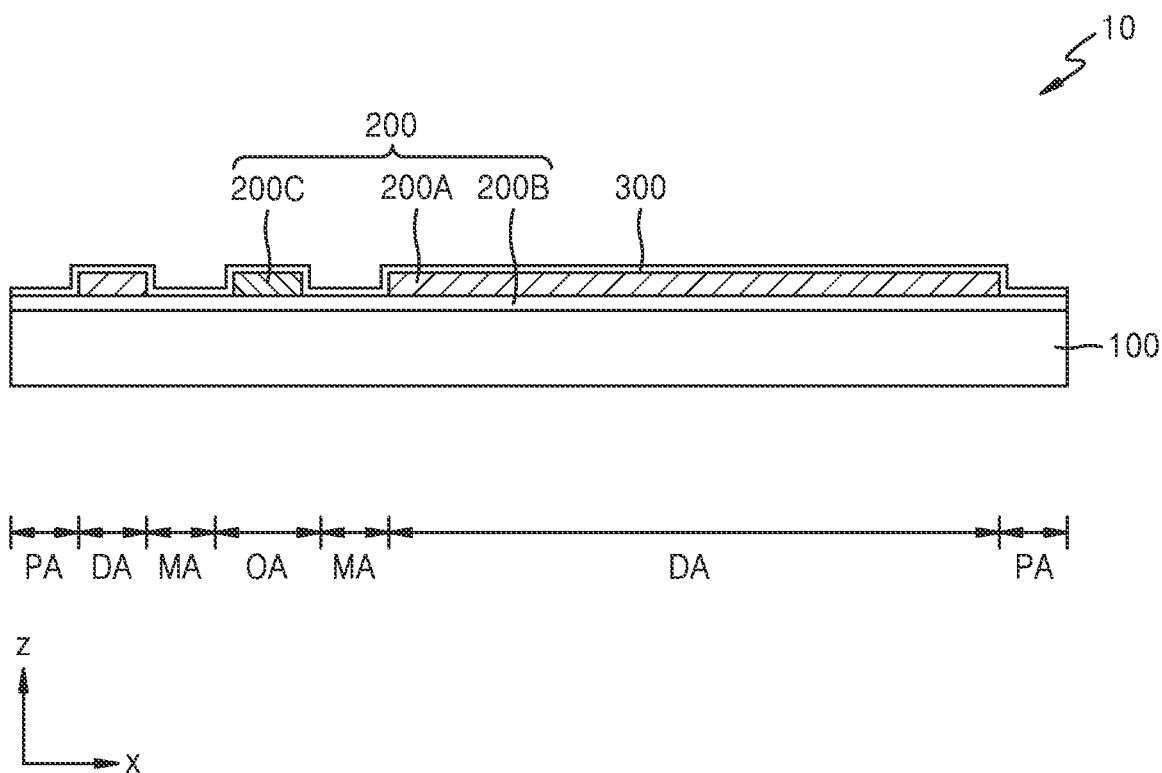

While the display element layer 200A is not arranged in the first area OA in FIGS. 4A through 4C, the embodiments are not limited thereto. According to some example embodiments, as illustrated in FIG. 4D, an auxiliary display element layer 200C may be located in the first area OA. The auxiliary display element layer 200C may include a display element that has a different structure from the display element of the display element layer 200A or/and operates in a different manner from the display element of the display element layer 200A.

According to some example embodiments, each pixel of the display element layer 200A may include an active-type organic light-emitting diode, and the auxiliary display element layer 200C may include pixels including a passive-type organic light-emitting diode. When the auxiliary display element layer 200C includes a display element of a passive-type organic light-emitting diode, components that constitute a pixel circuit may be omitted under the passive-type organic light-emitting diode. For example, a portion of the pixel circuit layer 200B under the auxiliary display element layer 200C does not include a transistor and a storage capacitor.

According to some example embodiments, the auxiliary display element layer 200C may include a display element of a same type as the display element layer 200A (for example, an active type organic light-emitting diode), but a pixel circuit under the auxiliary display element layer 200C may have a different structure. For example, the pixel circuit under the auxiliary display element layer 200C (for example, a pixel circuit including a light shielding layer between a substrate and a transistor) may have a different structure from the pixel circuit under the display element layer 200A. Alternatively, display elements of the auxiliary display element layer 200C may operate according to a control signal different from those for the display elements of the display element layer 200A. In the first area OA where the auxiliary display element layer 200C is arranged, a component that does not require a relatively high transmittance (for example, an infrared sensor) may be arranged. In this case, the first area OA may be regarded both as a component area and an auxiliary display area.

Figure 5:
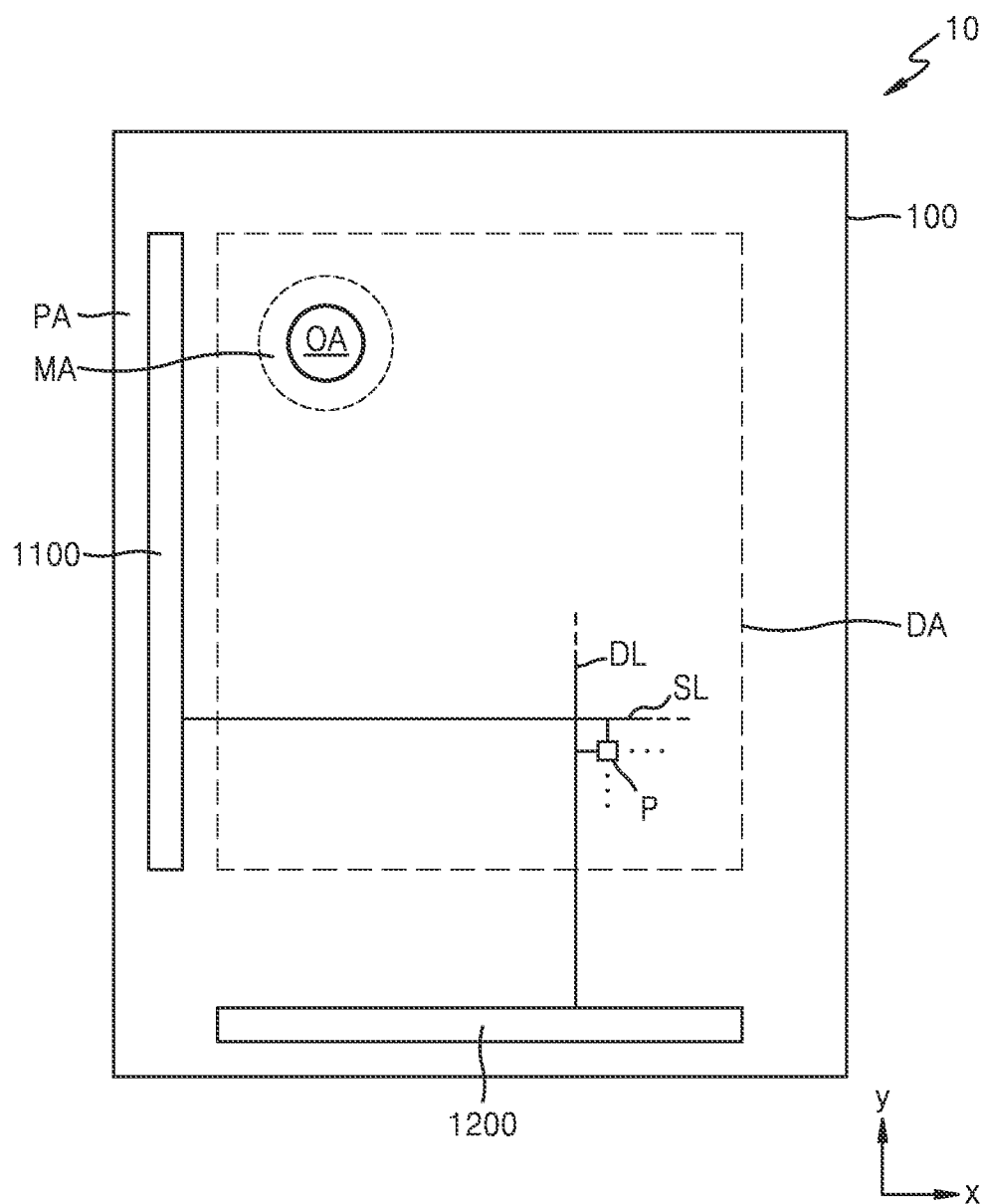
FIG. 5 is a schematic plan view of a display panel according to some example embodiments.
Figure 6:
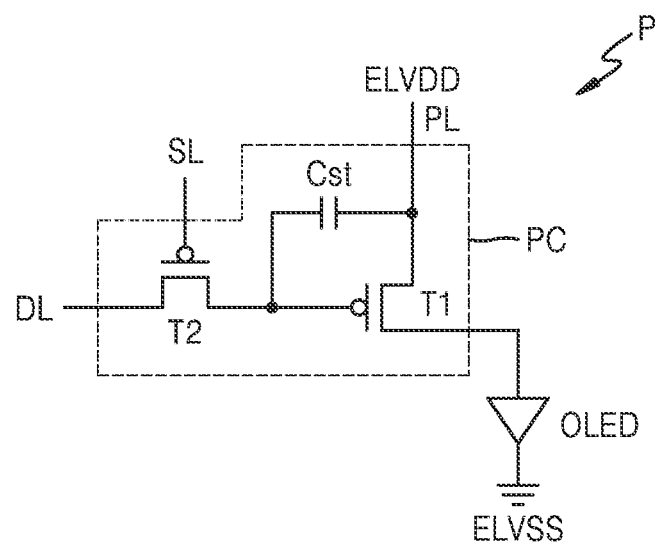
FIG. 6 is a schematic equivalent circuit diagram of a pixel of a display panel according to some example embodiments.

FIG. 5 is a plan view schematically illustrating a display panel 10 according to some example embodiments, and FIG. 6 is an equivalent circuit diagram schematically illustrating any pixel of the display panel 10.

Referring to FIG. 5, the display panel 10 may include a first area OA, a display area DA, which is a second area, a middle area MA, which is a third area, and a peripheral area PA, which is a fourth area. FIG. 5 may be understood as the substrate 100 included in the display panel 10. For example, it may be understood that the substrate 100 includes the first area OA, the display area DA, the middle area MA, and the peripheral area PA.

The display panel 10 includes a plurality of pixels P arranged in the display area DA. Each pixel P may include a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit red light, green light, blue light, or white light, through the organic light-emitting diode OLED.

The second thin film transistor T2 is a switching thin film transistor and is connected to a scan line SL and a data line DL. The second thin film transistor T2 may transfer a data voltage input via the data line DL to the first thin film transistor T1 based on a switching voltage input via the scan line SL. The storage capacitor Cst is connected to the second thin film transistor T2 and a driving voltage line PL, and may store a voltage corresponding to a voltage received from the second thin film transistor T2 and a first power voltage ELVDD supplied to the driving voltage line PL.

The first thin film transistor T1 is a driving thin film transistor and is connected to the driving voltage line PL and the storage capacitor Cst, and may control a driving current flowing through the organic light-emitting diode OLED from the driving voltage line PL, in accordance with a voltage value stored in the storage capacitor Cst. The organic light-emitting diode OLED may emit light having a certain brightness via a driving current. An opposite electrode (for example, a cathode) of the organic light-emitting diode OLED may receive a second power voltage ELVSS.

FIG. 6 illustrates that the pixel circuit PC includes two thin film transistors and one storage capacitor, but the embodiments are not limited thereto. The number of thin film transistors and the number of storage capacitors may vary according to a design of the pixel circuit PC. For example, the pixel circuit PC may further include four or more thin film transistors in addition to the above-described two thin film transistors.

Referring back to FIG. 5, the middle area MA may surround the first area OA in a plan view. The middle area MA is an area where a display element such as an organic light-emitting diode is not arranged. In the middle area MA, signal lines via which a signal is provided to the pixels P arranged in the periphery of the first area OA may be located the middle area MA. In the peripheral area PA, a scan driver 1100 providing a scan signal to each pixel P, a data driver 1200 providing a data signal to each pixel P, main power wirings (not shown) via which first and second power voltages are provided, or the like may be arranged. While FIG. 5 illustrates that the data driver 1200 is arranged adjacent to a side of the substrate 100, according to some example embodiments, the data driver 1200 may be arranged on a flexible printed circuit board (FPCB) that is electrically connected to a pad arranged at a side of the display panel 10.

Figure 7:
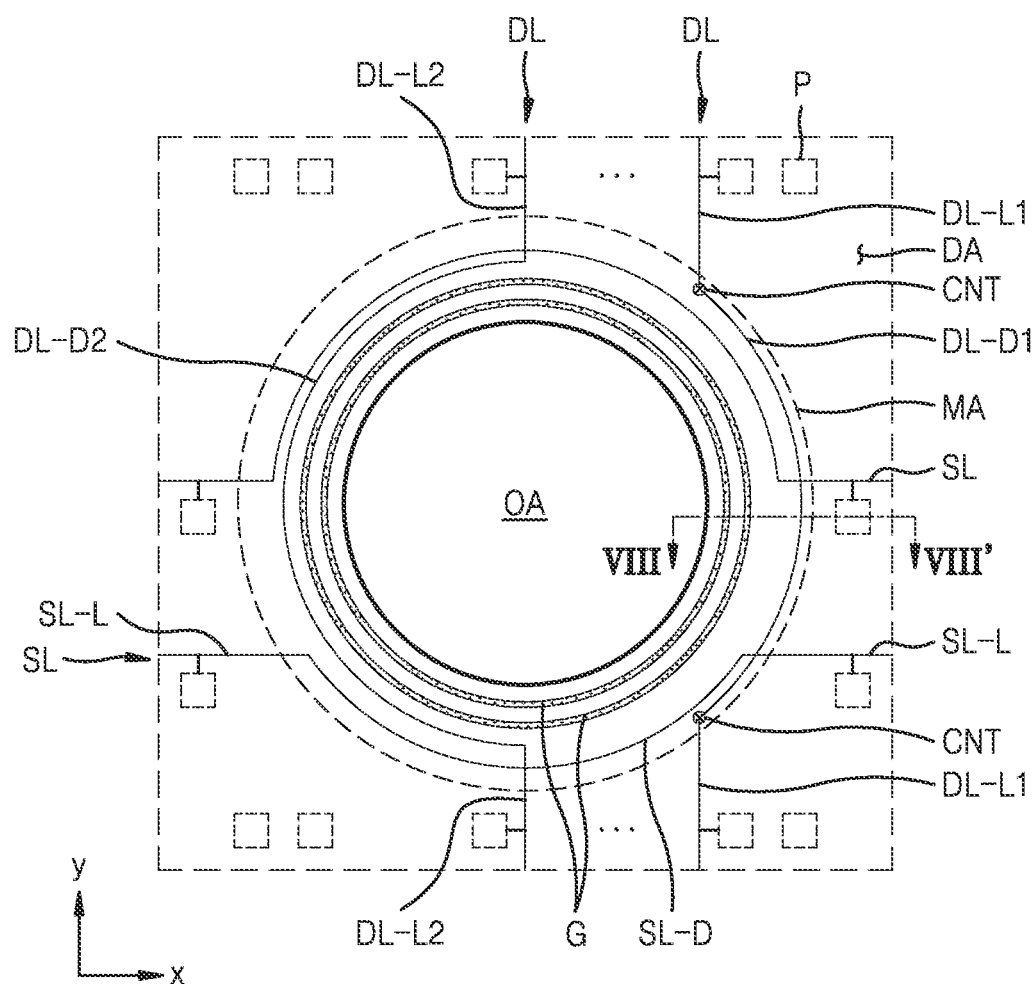
FIG. 7 is a plan view of a portion of a display panel according to some example embodiments.

FIG. 7 is a schematic plan view of a portion of a display panel according to an embodiment.

Referring to FIG. 7, pixels P may be spaced apart from each other around the first area OA. The first area OA may be defined among the pixels P. For example, as shown in the plan view of FIG. 7, pixels P may be arranged above and below the first area OA, and pixels P may be arranged on the left and right of the first area OA.

Signals lines that are used to supply a signal to the pixels P and are adjacent to the first area OA may detour around the first area OA. At least one data line DL from among the data lines DL that cross the display area DA on a plane of FIG. 7 may extend in a y-direction to provide a data signal to the pixels P arranged above and below the first area OA, and may detour along a boundary of the first area OA in the middle area MA at the same time. At least one scan line SL from among the scan lines SL that cross the display area DA in a plane view may extend in an x-direction to provide a scan signal to the pixels P arranged on the left and the right of the first area OA, and may detour along a boundary of the first area OA in the middle area MA at the same time.

A circuitous portion (or bypass portion) SL-D of a scan line SL is located on a same layer as an extension portion SL-L crossing the display area DA. The circuitous portion SL-D may be integrally formed with an extension portion SL-L. A circuitous portion DL-D1 of a data line DL from among the data lines DL may be formed on a layer different from an extension portion DL-L1 crossing the display area DA, and the circuitous portion DL-D1 and the extension portion DL-L1 of the data line DL may be connected via a contact hole CNT. A circuitous portion DL-D2 of another data line DL from among the data lines DL is located on a same layer as the extension portion DL-L2 and may be integrally formed with an extension portion DL-L2.

One or more grooves G may be located between the first area OA and an area where the scan lines SL and the data lines DL detour around the first area OA. In a plan view, the grooves G may each have a ring shape surrounding the first area OA, and the grooves G may be apart from each other.

Figure 8:
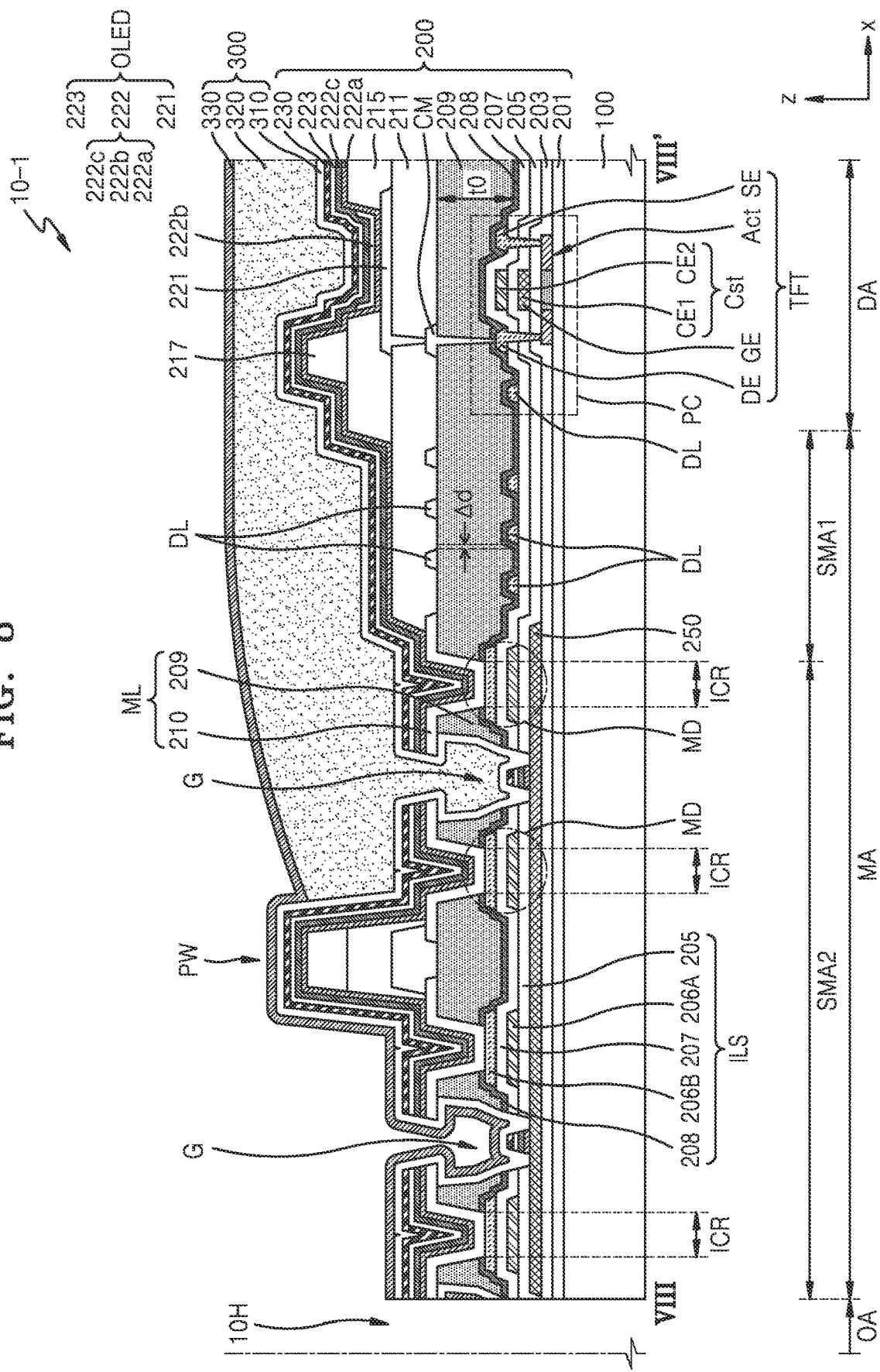
FIG. 8 is a cross-sectional view of a display panel according to some example embodiments.

FIG. 8 is a cross-sectional view of a display panel according to an embodiment and may correspond to a cross-sectional view taken along line VIII-VIII' of FIG. 7. FIGS. 9A through 9C and 9E are cross-sectional views of a display panel during a manufacturing process according to some example embodiments. FIG. 9D is an enlarged cross-sectional view of a region IXd of FIG. 9C. FIG. 9F is a modified embodiment of the display panel of FIG. 9B.

Referring to the display area DA of FIG. 8, the substrate 100 may include a glass material or a polymer resin. According to some example embodiments, the substrate 100 may include a plurality of sub-layers as illustrated in the enlarged view of FIG. 4A above.

A buffer layer 201 may be formed on the substrate 100 to prevent impurities from penetrating into a semiconductor layer Act of the thin film transistor TFT. The buffer layer 201 may include an inorganic insulation material, such as silicon nitride, silicon oxynitride, and silicon oxide, and may be a single layer or a multi-layer including the above-described inorganic insulation material.

The pixel circuit PC may be arranged on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE.

A data line DL of the pixel circuit PC is not illustrated in FIG. 8, but is electrically connected to a switching thin film transistor included in the pixel circuit PC. According to some example embodiments, a top gate-type thin film transistor in which the gate electrode GE is arranged on the semiconductor layer Act with a gate insulating layer 203 between the gate electrode GE and the semiconductor layer Act is illustrated. However, according to some example embodiments, the thin film transistor TFT may also be a bottom gate-type.

The semiconductor layer Act may include polysilicon. Alternatively, the semiconductor layer Act may include amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like, and may include a multi-layer or a single layer including the above-described material.

The gate insulating layer 203 between the semiconductor layer Act and the gate electrode GE may include an inorganic insulation material such as silicon oxide, silicon nitride, silicon oxynitride, aluminum oxide, titanium oxide, tantalum oxide, hafnium oxide, or the like. The gate insulating layer 203 may be a single layer or a multi-layer including the above-described material.

The source electrode SE and the drain electrode DE may be located on a same layer as the data line DL and may include a same material as the data line. The source electrode SE, the drain electrode DE, and the data line DL may include a material having high conductivity. The source electrode SE and the drain electrode DE may include a conductive material including molybdenum (Mo), aluminum (Al), copper (Cu), titanium (Ti), or the like, and may include a multi-layer or a single layer including the above-described material. According to some example embodiments, the source electrode SE, the drain electrode DE, and the data line DL may each include a multi-layer of Ti/Al/Ti.

The storage capacitor Cst may include a lower electrode CE1 and an upper electrode CE2, which overlap each other with a first interlayer insulating layer 205 therebetween. The storage capacitor Cst may overlap the thin film transistor TFT. In this regard, FIG. 8 illustrates the gate electrode GE of the thin film transistor TFT as the lower electrode CE1 of the storage capacitor Cst. According to some example embodiments, the storage capacitor Cst may not overlap the thin film transistor TFT. The storage capacitor Cst may be covered by a second interlayer insulating layer 207. The upper electrode CE2 of the storage capacitor Cst may include a conductive material including molybdenum (Mo), aluminum (Al), copper (Cu), titanium (Ti), or the like, and may include a multi-layer or a single layer including the above-described material.

The first interlayer insulating layer 205 and the second interlayer insulating layer 207 may each include an inorganic insulation material such as silicon oxide, silicon nitride, silicon oxynitride, aluminum oxide, titanium oxide, tantalum oxide, hafnium oxide, or the like. The first interlayer insulating layer 205 and the second interlayer insulating layer 207 may each include a single layer or a multi-layer including the above-described material.

The pixel circuit PC including the thin film transistor TFT and the storage capacitor Cst may be covered by a first organic insulating layer 209. The first organic insulating layer 209 may include an approximately flat upper surface.

A third interlayer insulating layer 208 may be arranged under the first organic insulating layer 209. The third interlayer insulating layer 208 may include an inorganic insulation material such as silicon oxide, silicon nitride, and silicon oxynitride.

The pixel circuit PC may be electrically connected to the pixel electrode 221. For example, as illustrated in FIG. 8, a contact metal layer CM may be arranged between the thin film transistor TFT and the pixel electrode 221. The contact metal layer CM may be connected to the thin film transistor TFT via a contact hole formed in the first organic insulating layer 209, and the pixel electrode 221 may be connected to the contact metal layer CM via a contact hole formed in a second organic insulating layer 211 on the contact metal layer CM. The contact metal layer CM may include a conductive material including molybdenum (Mo), aluminum (Al), copper (Cu), titanium (Ti), or the like, and may include a multi-layer or a single layer including the above-described material. According to some example embodiments, the contact metal layer CM may include a multi-layer of Ti/Al/Ti.

The first organic insulating layer 209 and the second organic insulating layer 211 may include an organic insulating material such as a general-use polymer, for example, polymethylmethacrylate (PMMA) or polystyrene (PS), a polymer derivative having a phenolic group, an acrylic polymer, an imide polymer, an aryl ether polymer, an amide polymer, a fluorine polymer, a p-xylene polymer, a vinyl alcohol-based polymer, and a blend thereof. According to some example embodiments, the first organic insulating layer 209 and the second organic insulating layer 211 may each include polyimide.

The pixel electrode 221 may be formed on the second organic insulating layer 211. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some example embodiments, the pixel electrode 221 may further include a film formed of ITO, IZO, ZnO, or $In_2O_3$ on or under the above-described reflective layer.

A pixel defining layer 215 may be formed on the pixel electrode 221. The pixel defining layer 215 may include an opening exposing an upper surface of the pixel electrode 221 and cover edges of the pixel electrode 221. The pixel defining layer 215 may include an organic insulation material. Alternatively, the pixel defining layer 215 may include an inorganic insulating material such as silicon nitride, silicon oxynitride, or silicon oxide. Alternatively, the pixel defining layer 215 may include an organic insulation material and an inorganic insulation material.

An intermediate layer 222 includes an emissive layer 222b. The intermediate layer 222 may include a first functional layer 222a arranged under the emissive layer 222b and/or a second functional layer 222c arranged on the emissive layer 222b. The emissive layer 222b may include a polymer or a low-molecular-weight organic material that emits light of a predefined color.

The first functional layer 222a may be a single layer or a multi-layer. For example, when the first functional layer 222a is formed of a polymer material, the first functional layer 222a may include a hole transport layer (HTL) having a single-layer structure and may be formed of poly-(3,4)-ethylene-dihydroxy thiophene (PEDOT) or polyaniline (PANI). When the first functional layer 222a is formed of a low-molecular-weight material, the first functional layer 222a may include a hole injection layer (HIL) and an HTL.

The second functional layer 222c may be omitted. For example, when the first functional layer 222a and the emissive layer 222b are formed of a polymer material, the second functional layer 222c may preferably be formed. The second functional layer 222c may include a single layer or a multi-layer. The second functional layer 222c may include an electron transport layer (ETL) and/or an electron injection layer (EIL).

The emissive layer 222b of the intermediate layer 222 may be arranged in each pixel in the display area DA. The emissive layer 222b may be patterned to correspond to the pixel electrode 221. Unlike the emissive layer 222b, the first functional layer 222a and/or the second functional layer 222c of the intermediate layer 222 may extend toward the middle area MA to not only be in the display area DA but also in the middle area MA.

The opposite electrode 223 may be formed of a conductive material having a low work function. For example, the opposite electrode 223 may include a (semi)transparent layer including Ag, Mg, Al, Pt, Pd, Au, Ni, Nd, Ir, Cr, Li, Ca, or an alloy thereof. Alternatively, the opposite electrode 223 may further include a material such as ITO, IZO, ZnO, or $In_2O_3$ on the (semi)transparent layer including the above-described material. The opposite electrode 223 may be formed not only in the display area DA but also in the middle area MA. The first functional layer 222a, the second functional layer 222c, and the opposite electrode 223 may be formed using a thermal deposition method.

A capping layer 230 may be located on the opposite electrode 223. For example, the capping layer 230 may include LiF, and may be formed using a thermal deposition method. In some embodiments, the capping layer 230 may be omitted.

A spacer 217 may be formed on the pixel defining layer 215. The spacer 217 may include an organic insulation material such as polyimide. Alternatively, the spacer 217 may include an inorganic insulation material or both an organic insulation material and an inorganic insulation material.

The spacer 217 may include a different material from the pixel defining layer 215, or a same material as the pixel defining layer 215. According to some example embodiments, the pixel defining layer 215 and the spacer 217 may include polyimide. The pixel defining layer 215 and the spacer 217 may be formed together in a mask process using a halftone mask.

The organic light emitting diode OLED may be covered by the thin film encapsulation layer 300. The thin film encapsulation layer 300 may include at least one organic encapsulation layer and at least one inorganic encapsulation layer. According to some example embodiments, FIG. 8 illustrates that the thin film encapsulation layer 300 includes first and second inorganic encapsulation layers 310 and 330 and an organic encapsulation layer 320 therebetween. According to some example embodiments, the number of organic encapsulation layers, the number of inorganic encapsulation layers, and an order of stacking the layers may be modified.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each include a single layer or a multi-layer including the above-described material. The organic encapsulation layer 320 may include a polymer-based material. Examples of the polymer-based material may include an acrylic resin, an epoxy resin, polyimide, and polyethylene. According to some example embodiments, the organic encapsulation layer 320 may include acrylate.

The first inorganic encapsulation layer 310 and the second inorganic encapsulation layer 330 may have different thicknesses. The first inorganic encapsulation layer 310 may be thicker than the second inorganic encapsulation layer 330. Alternatively, the second inorganic encapsulation layer 330 may be thicker than the first inorganic encapsulation layer 310, or the first inorganic encapsulation layer 310 may have a same thickness as that of the second inorganic encapsulation layer 330.

Referring to the middle area MA of FIG. 8, the middle area MA may include a first sub-middle area SMA1 that is relatively far from the first area OA and a second sub-middle area MA2 that is relatively close to the first area OA. In the middle area MA, lines and grooves G that detour around the first area OA may be arranged.

Lines, for example, the data lines DL as illustrated in FIG. 8, may be located in the first sub-middle area SMA1. The data lines DL of the first sub-middle area SMA1 illustrated in FIG. 8 correspond to the circuitous portions (for example, DL-D1 or DL-D2) of the data lines DL described above with reference to FIG. 7. The first sub-middle area SMA1 may be understood as a line area detoured by lines such as the data lines DL described above or a detour area.

The data lines DL may be alternately arranged with an insulating layer therebetween. For example, one of the neighboring data lines DL may be arranged below an insulating layer (for example, the first organic insulating layer 209), and the other may be arranged on an insulating layer (for example, the first organic insulating layer 209), and in this manner, the data lines DL are alternately arranged on and below the first organic insulating layer 209. When the data lines DL are alternately arranged, a distance (Δd, pitch) between the date lines DL may be reduced. Although the data lines DL located in the first sub-middle area SMA1 are illustrated in FIG. 8, the scan lines SL, for example, the circuitous portions of the scan lines SL, may also be located in the first sub-middle area SMA1.

The data lines DL arranged below the first organic insulating layer 209 from among the data lines DL may be covered by a third interlayer insulating layer 208 extended to the middle area MA. An upper surface of the third interlayer insulating layer 208 may include a concave-convex surface. Here, the concave-convex surface may indicate not only a simple concave-convex surface, but also a surface having valleys among the data lines DL arranged under the third interlayer insulating layer 208. In this regard, FIG. 8 illustrates that valleys having an approximately V-shape or U-shape are formed.

In the second sub-middle area SMA2, one or more grooves G may be arranged. An organic material layer included in the intermediate layer 222, for example, the first functional layer 222a and/or the second functional layer 222c, may be disconnected (or separated) by the grooves G. The second sub-middle area SMA2 may be understood as a disconnected area (or a separated area) of a groove area or an organic material layer.

The groove G may be formed in a multi-layered film ML between the substrate 100 and the pixel electrode 221. The multi-layered film ML may include a first sub-layer and a second sub-layer on the first sub-layer, and in this regard, FIG. 8 illustrates the multi-layered film ML including the first organic insulating layer 209 as a first sub-layer and an inorganic layer 210 as a second sub-layer. The inorganic layer 210 may be located on a same layer (for example, the first organic insulating layer 209) as the contact metal layer CM, and may be formed in a same mask process as the contact metal layer CM. The inorganic layer 210 may include a same material as the contact metal layer CM. For example, the inorganic layer 210 may include a metal, and the inorganic layer 210 may include three sub-layers such as Ti/Al/Ti.

An inorganic structure ILS may be located between the substrate 100 and the multi-layered film ML. The inorganic structure ILS may include one or more sub-layers, and the sub-layers may include an inorganic material. For example, the inorganic structure ILS may include at least one inorganic insulating layer and/or at least one metal layer. According to some example embodiments, as illustrated in FIG. 8, the inorganic structure ILS may include a first interlayer insulating layer 205, a first metal layer 206A, a second interlayer insulating layer 207, a second metal layer 206B, and a third interlayer insulating layer 208. As the inorganic structure ILS includes mounds MD located at both sides of the groove G with the groove G therebetween, a depth of the groove G may be increased.

Figure 9A:
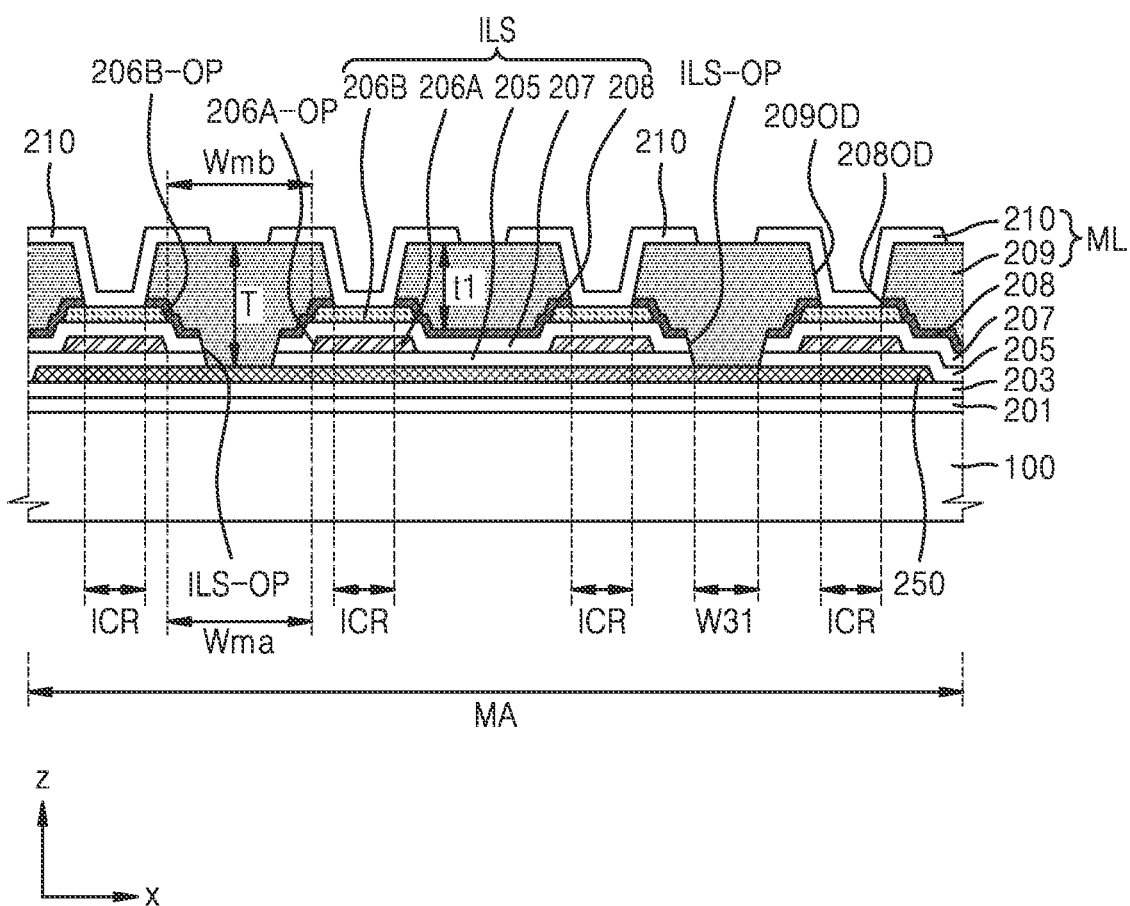
FIGS. 9A through 9C and 9E are cross-sectional views of a display panel manufacturing process according to some example embodiments.

Referring to FIG. 9A, the inorganic structure ILS may be arranged on the substrate 100 before performing an operation of forming the first organic insulating layer 209. The inorganic structure ILS may include an inorganic insulating layer and/or a metal layer. According to some example embodiments, FIG. 9A illustrates that the inorganic structure ILS includes the first interlayer insulating layer 205, the first metal layer 206A, the second interlayer insulating layer 207, the second metal layer 206B, and the third interlayer insulating layer 208. According to some example embodiments, one or more of the first interlayer insulating layer 205, the first metal layer 206A, the second interlayer insulating layer 207, the second metal layer 206B, and the third interlayer insulating layer 208 included in the inorganic structure ILS may be omitted.

The first metal layer 206A may be formed in a same process as forming the upper electrode CE2 of the storage capacitor Cst described with reference to FIG. 8, and may include a same material as the upper electrode CE2. The second metal layer 206B may be formed in a same process as forming the data line DL, the source electrode SE, and/or the drain electrode DE of the pixel circuit PC described with reference to FIG. 8, and may include a same material as these.

An inorganic insulating layer included in the inorganic structure ILS, for example, the first interlayer insulating layer 205, the second interlayer insulating layer 207, and/or the third interlayer insulating layer 208, may include an inorganic insulating material that is relatively resistant against moisture permeability. The first interlayer insulating layer 205, the second interlayer insulating layer 207, and/or the third interlayer insulating layer 208 may include silicon nitride and/or silicon oxide. Silicon nitride and silicon oxide are stronger against moisture than silicon oxynitride and are unlikely to be oxidized even when exposed to moisture.

The inorganic structure ILS may include a first opening ILS-OP. A metal layer included in the inorganic structure ILS may include a second opening corresponding to the first opening ILS-OP, and the second opening may have a greater width than a width W31 of the first opening ILS-OP. For example, a width Wma of a second-first opening 206A-OP of the first metal layer 206A may be greater than the width W31 of the first opening ILS-OP, and a width Wmb of a second-second opening 206B-OP of the second metal layer 206B may be greater than the width W31 of the first opening ILS-OP. The width W31 of the first opening ILS-OP formed in the inorganic structure ILS may be defined by a width of an opening passing through an inorganic insulating layer substantially included in the inorganic structure ILS, for example, the first interlayer insulating layer 205, the second interlayer insulating layer 207, and the third interlayer insulating layer 208.

The first organic insulating layer 209 may fill the first opening ILS-OP and be formed on the inorganic structure ILS. By leveling an organic material, a thickness T of a first portion of the first organic insulating layer 209 corresponding to the first opening ILS-OP of the inorganic structure ILS, which is greater than a thickness of other portions of the first organic insulating layer 209, may be formed. For example, the thickness T of the first portion of the first organic insulating layer 209 may be greater than a maximum thickness t0 (FIG. 8) of a second portion of the first organic insulating layer 209 corresponding to the display area DA. The thickness T of the first portion of the first organic insulating layer 209 may be greater than a maximum thickness t1 of a third portion of the first organic insulating layer 209 located on the inorganic structure ILS in the middle area MA.

The first portion of the first organic insulating layer 209 is removed in a process described later with reference to FIG. 9B, to form a groove G (FIG. 9B), and since the thickness T of the first portion is greater than those of other portions, a sufficient depth of the groove G may be ensured.

The inorganic layer 210 is located on the first organic insulating layer 209 and may be a metal layer in an embodiment. The inorganic layer 210 may be in contact with the second metal layer 206B thereunder through an opening 209OD formed in the first organic insulating layer 209 and an opening 208OD formed in the third interlayer insulating layer 208, and may form an inorganic contact area ICR.

According to some example embodiments, the third interlayer insulating layer 208 may not include the opening 208OD, and the inorganic layer 210 may contact an upper surface of the third interlayer insulating layer 208 through the opening 209OD formed in the first organic insulating layer 209. In this case, the inorganic contact area ICR may be formed by contact between the inorganic layer 210 and the third interlayer insulating layer 208.

A lower metal layer 250 may be located under the inorganic structure ILS. The lower metal layer 250 may be formed in a same process as forming the gate electrode GE or the lower electrode CE1 of the storage capacitor Cst described with reference to FIG. 8, and may include a same material as these.

Figure 9B:
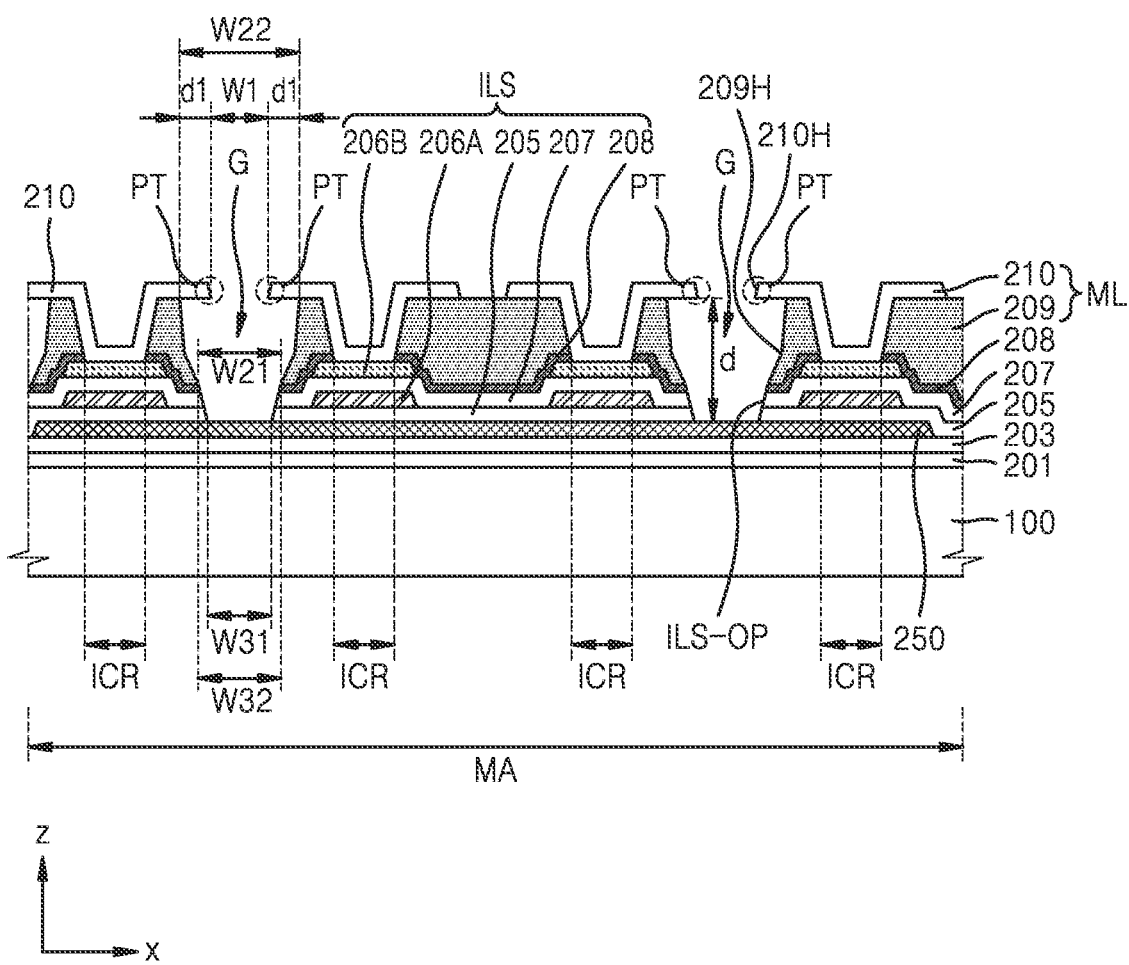

Referring to FIG. 9B, as the first portion of the first organic insulating layer 209 corresponding to a first hole 210H formed in the inorganic layer 210 is etched, a second hole 209H may be formed in the first organic insulating layer 209. The groove G may be defined in the multi-layered film ML of the inorganic layer 210 and the first organic insulating layer 209, and may include a first hole 210H and a second hole 209H that overlap each other.

The second hole 209H is formed by etching the first portion of the first organic insulating layer 209 located in the first opening ILS-OP as described above with reference to FIG. 9A. The lower metal layer 250 may function as an etch stopper of an etching process to form the second hole 209H. A bottom surface of the groove G may be at a same level surface as an upper surface of the lower metal layer 250. The bottom surface of the groove G may be at a same surface as the upper surface of the lower metal layer 250. The upper surface of the lower metal layer 250 may be the bottom surface of the groove G.

A width of the second hole 209H may be equal to or greater than a width of the first opening ILS-OP. For example, as illustrated in FIG. 9B, a width W21 of a lower portion of the second hole 209H may be substantially equal to a width W32 of an upper portion of the first opening ILS-OP. An interior surface of the inorganic structure ILS defining the first opening ILS-OP and an interior surface of the first organic insulating layer 209 defining the second hole 209H may constitute an interior surface of the groove G, and the first opening ILS-OP of the inorganic structure ILS may be regarded as defining the groove G together with the first hole 210H and the second hole 209H.

Alternatively, as illustrated in FIG. 9F, a width W21' of the lower portion of the second hole 209H may be greater than the width W32 of the upper portion of the first opening ILS-OP. The inorganic structure ILS and the first organic insulating layer 209 may form a step. An interior surface of the inorganic structure ILS defining the first opening ILS-OP, a portion of an upper surface of the inorganic structure ILS, and an interior surface of the first organic insulating layer 209 defining the second hole 209H may constitute an interior surface of the groove G. As described above, the first opening ILS-OP of the inorganic structure ILS may be regarded as defining the groove G together with the first hole 210H and the second hole 209H.

The groove G may have an undercut structure (or an undercut cross-section). The width W1 of the first hole 210H may be less than a width W22 of an upper portion of the second hole 209H. The inorganic layer 210 may include a pair of tips PT (or eaves) protruding toward a center of the groove G. For example, ends of the inorganic layer 210 defining the first hole 210H may protrude toward a center of the groove G and form a pair of tips PT. A length d1 of each tip PT may be about 1.0 μm or more, and about 2.0 μm or less. For example, a length d1 of the tips PT may be about 1.1 μm to about 1.7 μm, about 1.1 μm to about 1.5 μm, or about 1.1 μm to about 1.3 μm.

A length d of the groove G may be greater than the length d1 of the tips PT. For example, the length d of the groove G may be about 2.5 μm or greater. In detail, the length d of the groove G may be about 2.8 μm or more, or about 3.0 μm or more.

Figure 9C:
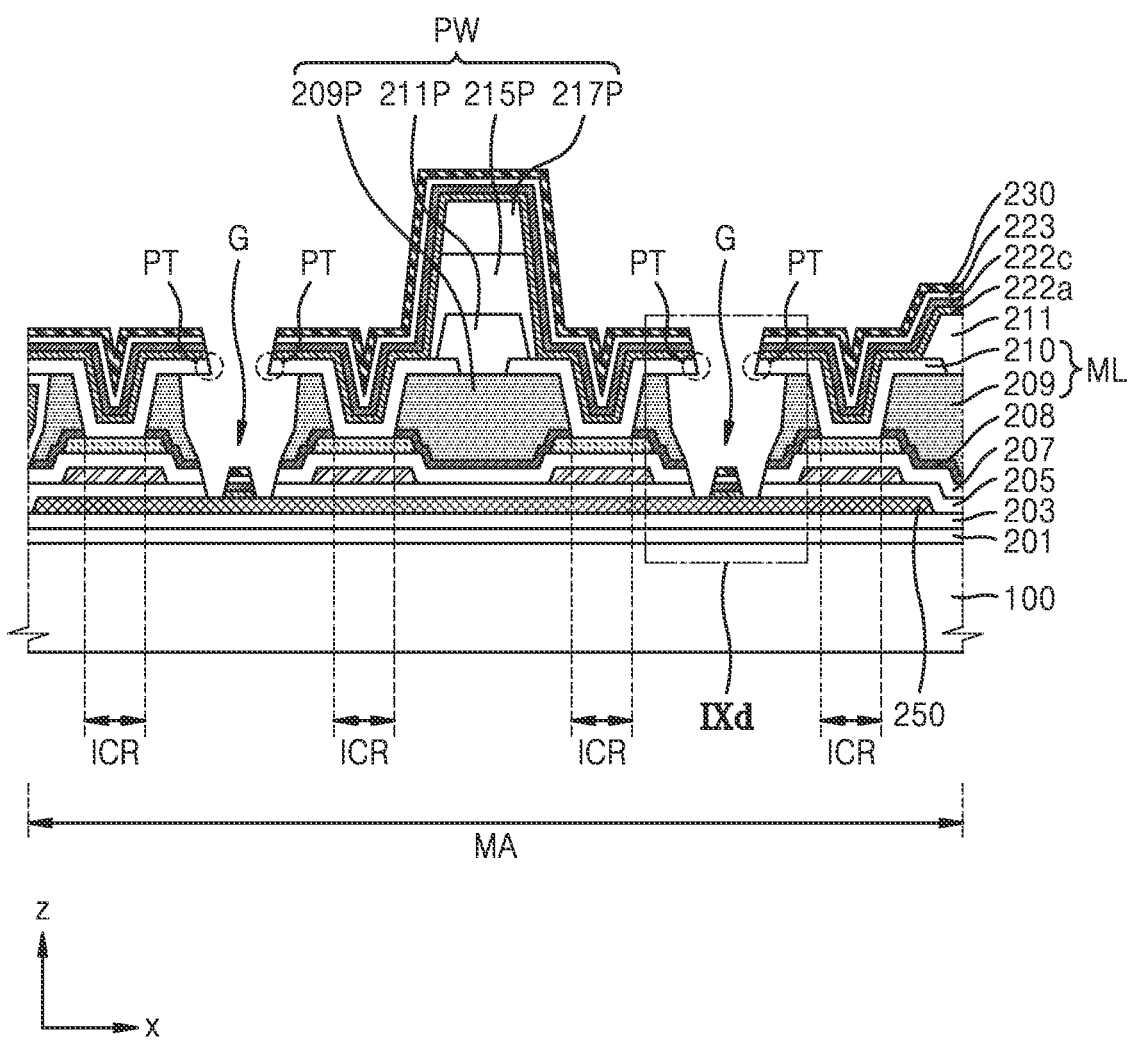
Figure 9D:
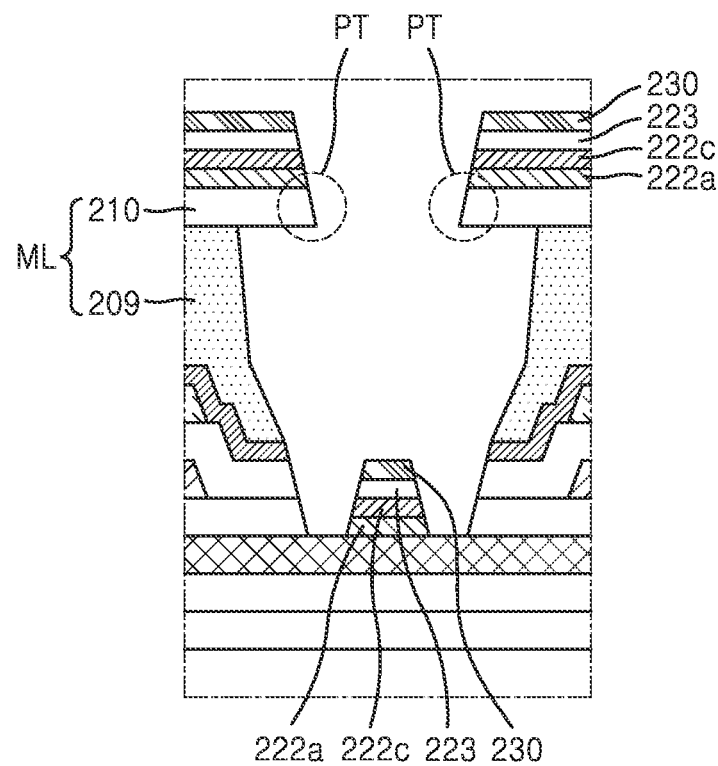
FIG. 9D is an enlarged cross-sectional view of a region IXd of FIG. 9C.

While the width W32 of the upper portion of the first opening ILS-OP is illustrated in FIGS. 9B and 9C as being greater than the width W31 of the lower portion of the first opening ILS-OP, the embodiments are not limited thereto. According to some example embodiments, the width W32 of the upper portion of the first opening ILS-OP of the inorganic structure ILS may be substantially equal to the width W31 of the lower portion of the first opening ILS-OP of the inorganic structure ILS. Although the width W22 of the upper portion of the second hole 209H is different from widths W21 and W21' of the lower portion of the second hole 209H in FIGS. 9B and 9C, the embodiments are not limited thereto. According to some example embodiments, the width W22 of the upper portion of the second hole 209H may be substantially equal to the widths W21 and W21' of the lower portion of the second hole 209H.

Referring to FIGS. 9C and 9D, after the groove G is formed, the intermediate layer 222 (FIG. 8) may be formed, and at least one organic material layer of the intermediate layer 222 may be disconnected or separated by the groove G. For example, the first functional layer 222a and/or the second functional layer 222c may be disconnected or separated by the groove G. Similarly, the opposite electrode 223 and the capping layer 230 may also be disconnected or separated by the groove G.

Before the intermediate layer 222 is formed, a partition wall PW may be formed in the middle area MA. The partition wall PW may include a plurality of sub-partition wall layers 211P, 215P, and 217P stacked on the first organic insulating layer 209. A portion 209P of the first organic insulating layer 209 may also form a partition wall PW. The plurality of sub-partition wall layers 211P, 215P, and 217P may respectively correspond to a portion of the second organic insulating layer 211, a portion of the pixel defining layer 215, and a portion of the spacer 217 described above with reference to FIG. 8. One or more of the plurality of sub-partition wall layers 211P, 215P, and 217P may be omitted. In this case, a height from the substrate 100 to an upper surface of the partition wall PW may be lower than a height from the substrate 100 to an upper surface of the spacer 217 in the display area DA (FIG. 8). While FIG. 9 illustrates one partition wall PW located in the middle area MA, according to some example embodiments, two or more partition walls may be located in the middle area MA.

Figure 9E:
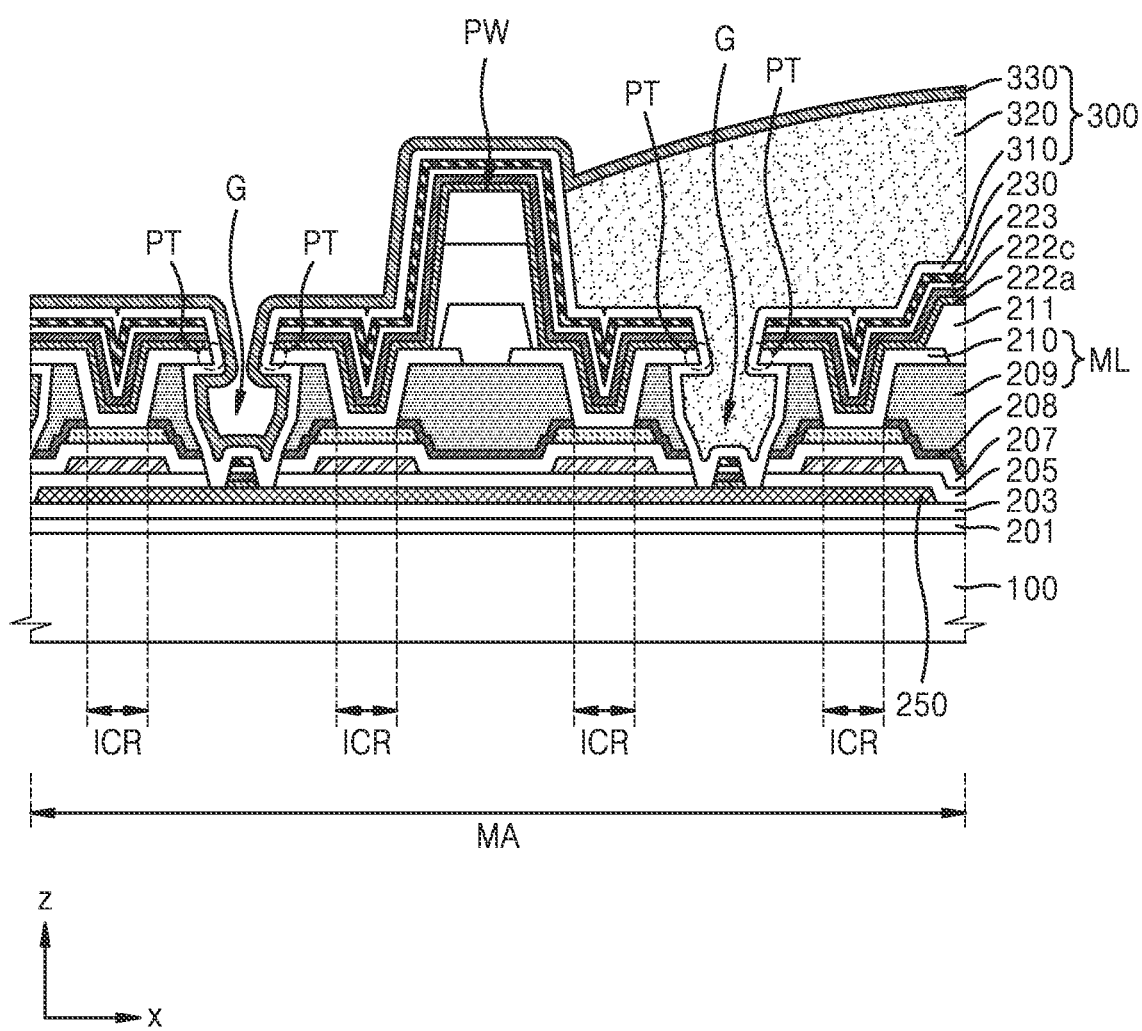
Figure 9F:
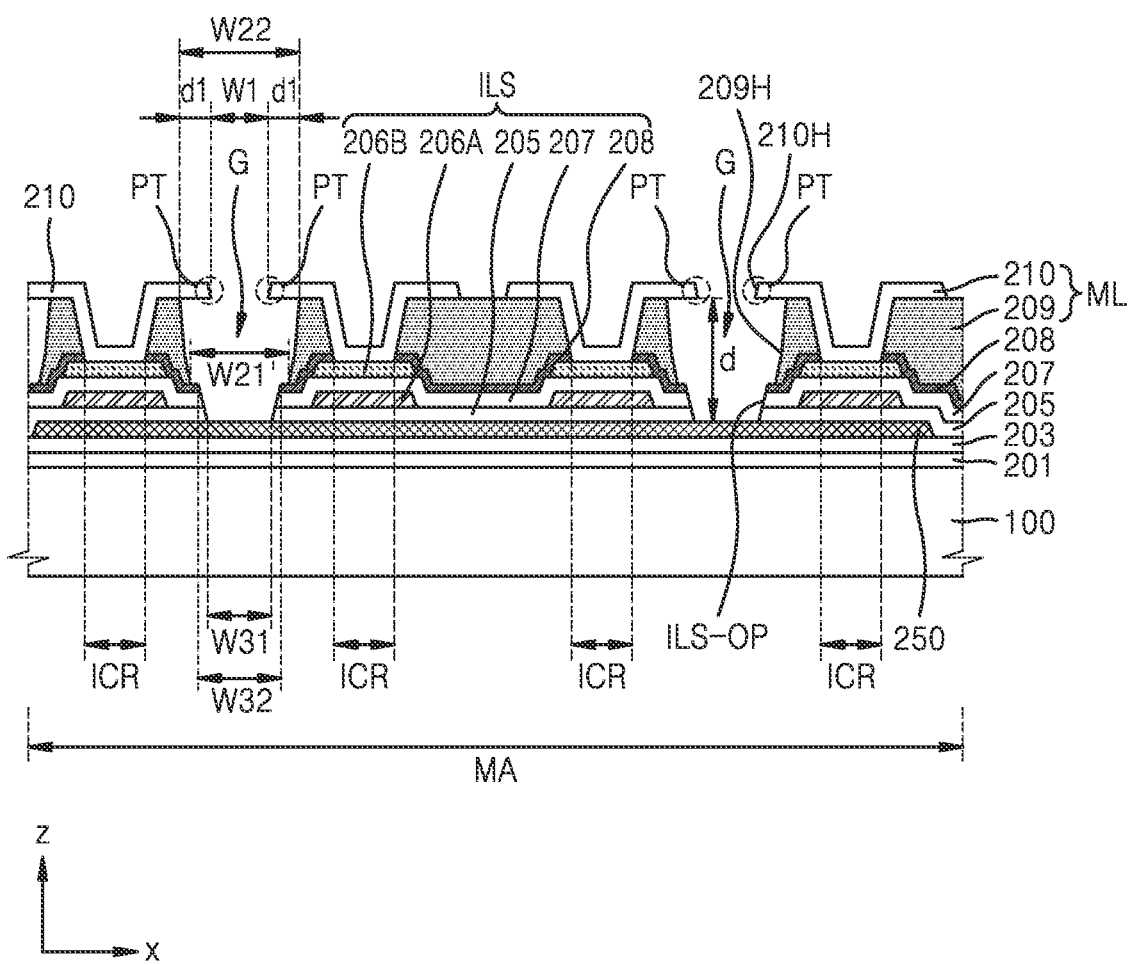
FIG. 9F illustrates a modified version of the display panel of FIG. 9B according to some example embodiments.

Referring to FIG. 9E, after the intermediate layer 222, the opposite electrode 223, and the capping layer 230 are formed, the thin film encapsulation layer 300 may be formed. The first inorganic encapsulation layer 310 and the second inorganic encapsulation layer 330 may be formed using a chemical vapor deposition method. As the first inorganic encapsulation layer 310 has relatively excellent step coverage, the first inorganic encapsulation layer 310 may be continuously formed to cover an inner surface of the groove G. For example, the first inorganic encapsulation layer 310 may extend while covering an upper surface, a lateral surface, and a lower surface of the tip PT, and may thus cover an interior surface of the first organic insulating layer 209 defining the second hole 209H (FIG. 9B) and organic material layers that are separated and located on a bottom surface of the groove G.

The organic encapsulation layer 320 may be between the first inorganic encapsulation layer 310 and the second inorganic encapsulation layer 330, and an end of the organic encapsulation layer 320 may be arranged adjacent to a side of the partition wall PW among neighboring grooves G. An interior space of some of the grooves G, for example, the grooves G that are adjacent to the display area DA may be at least partially filled by the organic encapsulation layer 320.

The second inorganic encapsulation layer 330 has also relatively excellent step coverage like the first inorganic encapsulation layer 310. Accordingly, the second inorganic encapsulation layer 330 may be continuously formed along the inner surface of the groove G that is not covered by the organic encapsulation layer 320 from among the grooves G.

Figure 10:
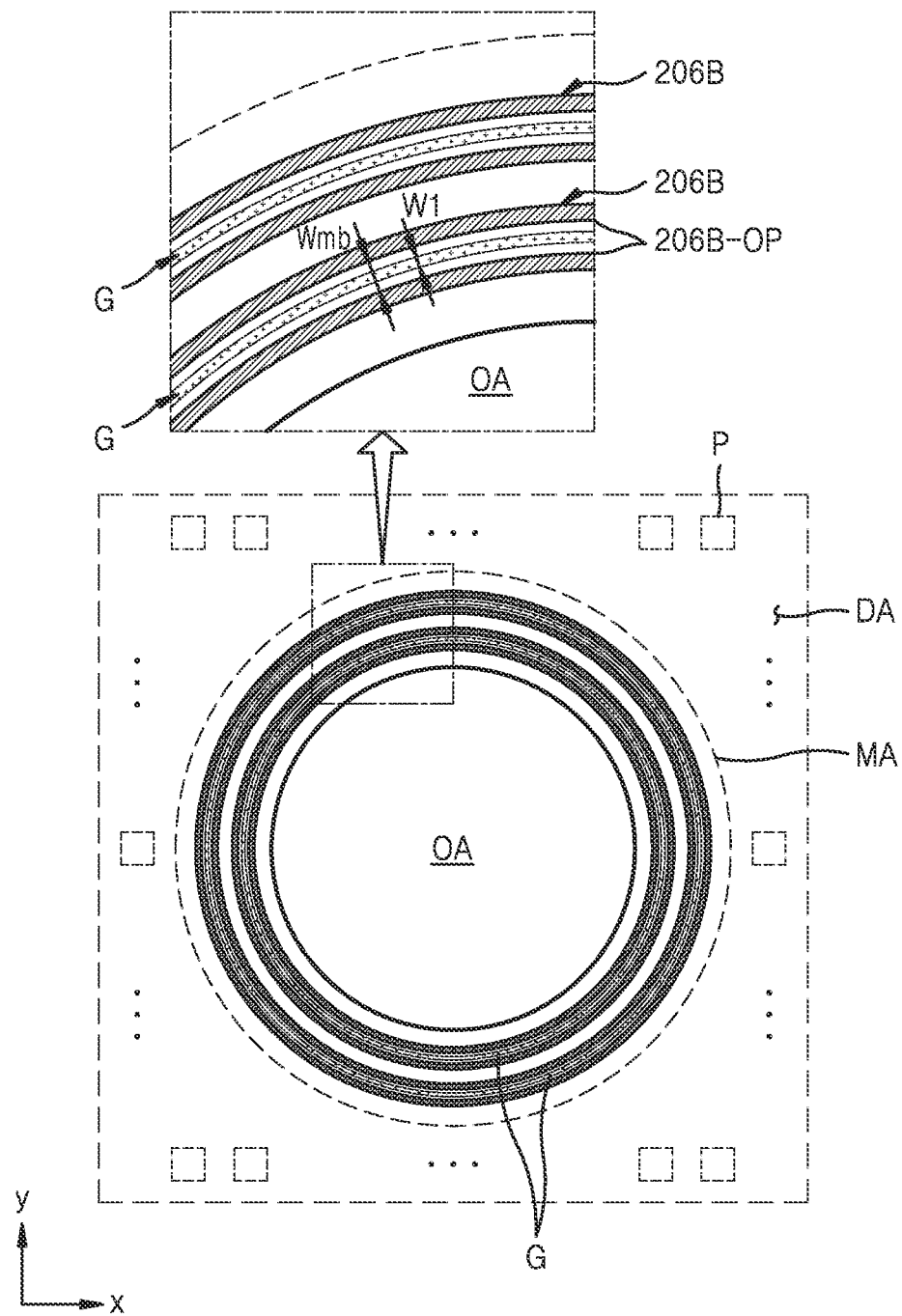
FIG. 10 is a plan view of a portion of a middle area of a display panel according to some example embodiments.

FIG. 10 is a plan view of a portion of a middle area of a display panel according to an embodiment. FIG. 10 shows an excerpt view of grooves and a metal layer included in an inorganic structure for the convenience of description. According to some example embodiments, the second metal layer 206B is illustrated as a metal layer included in the inorganic structure in FIG. 10; however, the structure of FIG. 10 is also applied to the first metal layer 206A described above with reference to FIG. 8.

Referring to FIG. 10, a plurality of grooves G are arranged around the first area OA, and the grooves G may respectively extend to surround the first area OA as described above with reference to FIG. 7.

Likewise, the second metal layer 206B may also extend to surround the first area OA. As illustrated in FIG. 10, the second metal layer 206B may have a ring shape surrounding the first area OA, and may include a second-second opening 206B-OP corresponding to the groove G.

A width Wmb of the second-second opening 206B-OP of the second metal layer 206B is greater than a width of the groove G. For example, the width Wmb of the second-second opening 206B-OP of the second metal layer 206B may correspond to a width of the groove G, for example, the width W1 of the first hole 210H of the inorganic layer 210 (FIGS. 8 and 9B).

Figure 11:
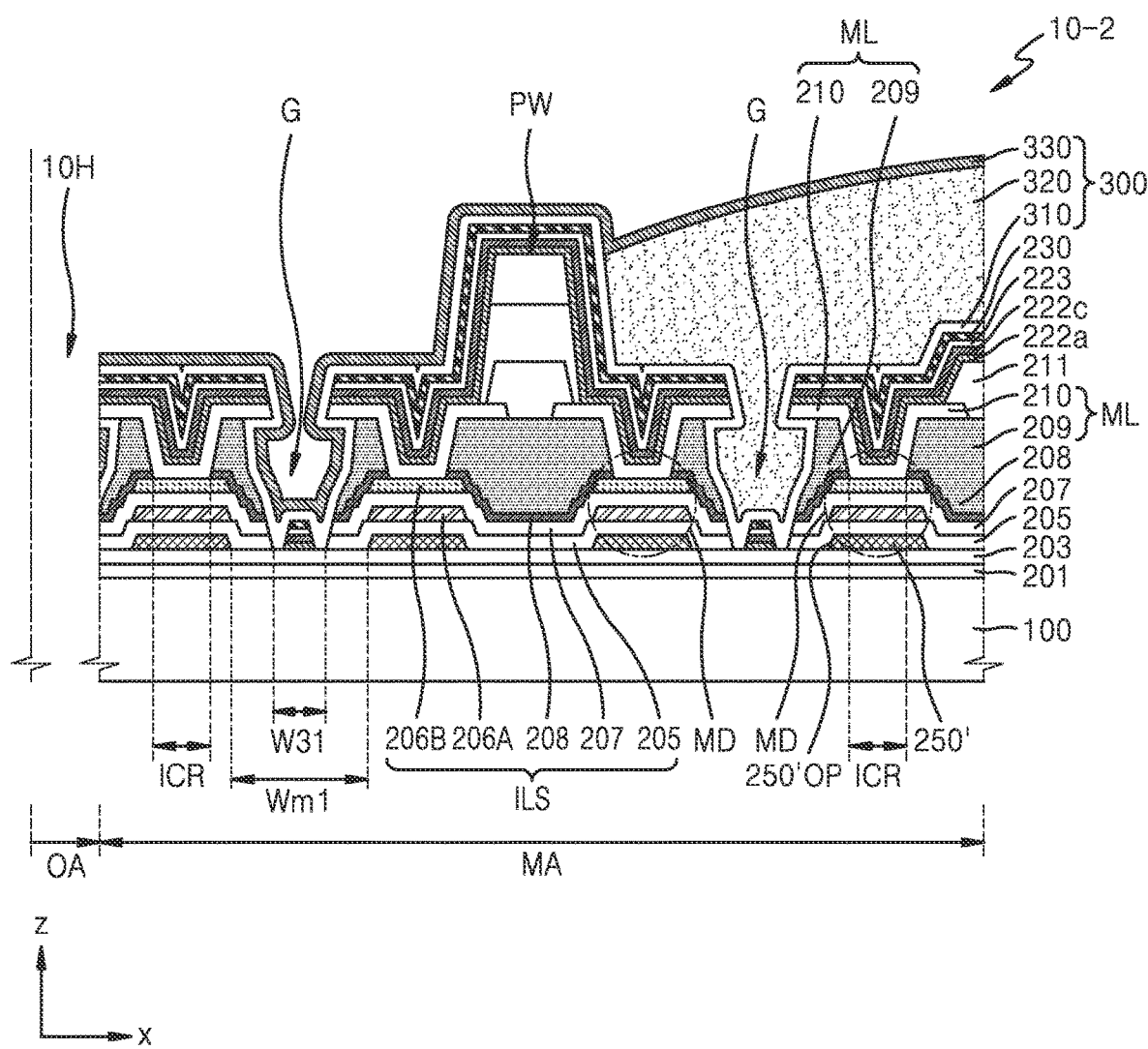
FIG. 11 is a cross-sectional view of a middle area of a display panel according to some example embodiments.

FIG. 11 is a cross-sectional view of a middle area of a display panel 10-2 according to another embodiment.

Referring to FIG. 11, the display panel 10-2 is different from the display panel 10-1 described above with reference to FIG. 8 in respect of a structure of a lower metal layer 250'.

Referring to FIG. 11, the lower metal layer 250' may include a third opening 250'OP corresponding to the groove G. A width Wm1 of the third opening 250'OP may be greater than the width W31 of the first opening ILS-OP of the inorganic structure ILS. A bottom surface of the groove G may be at a lower level than an upper surface of the lower metal layer 250'. A bottom surface of the groove G may be located on a virtual surface between an upper surface of the buffer layer 201 and an upper surface of the lower metal layer 250'. According to some example embodiments, as illustrated, for example, in FIG. 11, the bottom surface of the groove G is on a same surface as an upper surface of the gate insulating layer 203. The lower metal layer 250' including a third opening 250'OP may be regarded as a component of the inorganic structure ILS.

Figure 12:
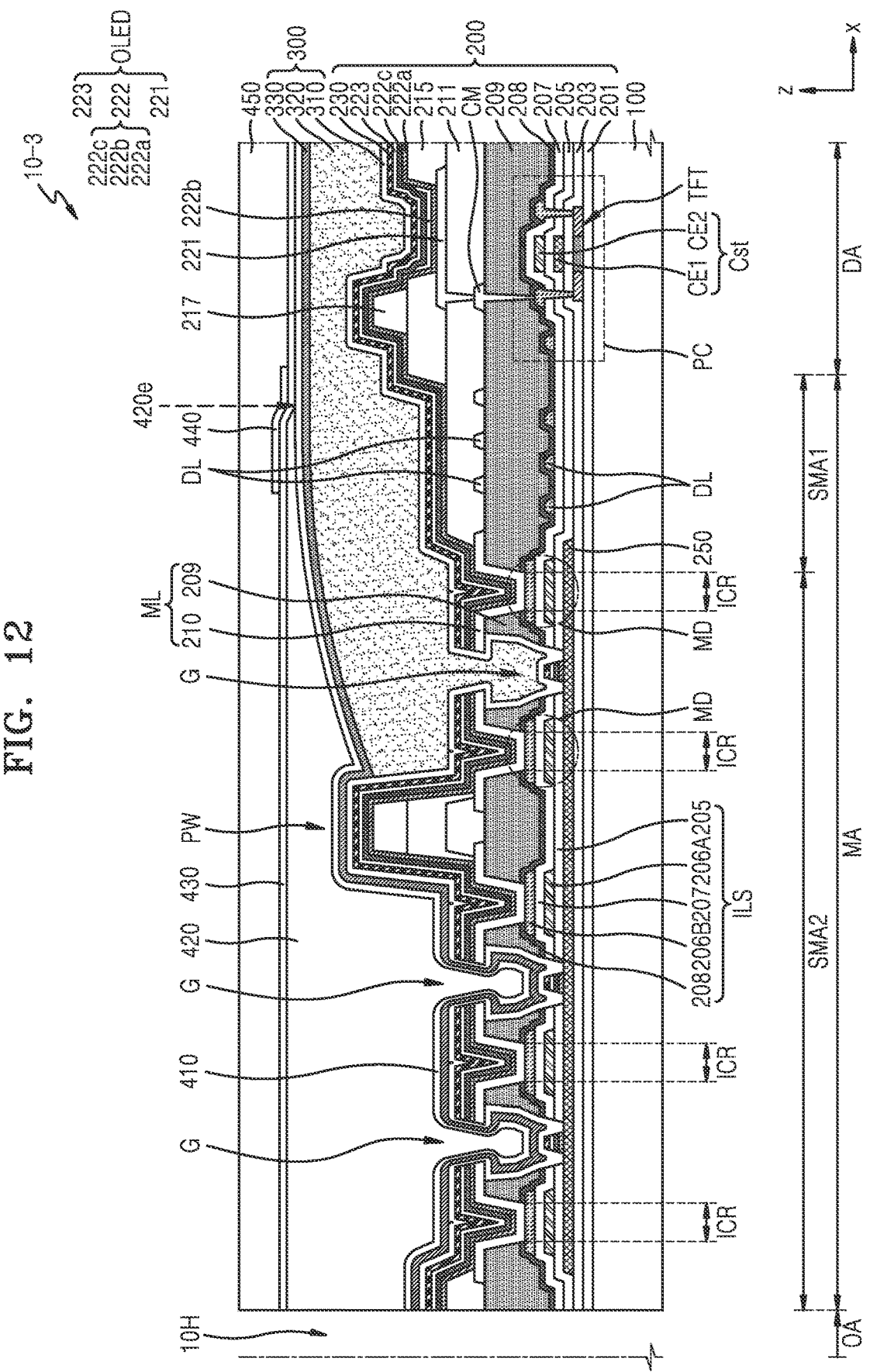
FIG. 12 is a schematic cross-sectional view of a display panel according to some example embodiments.

FIG. 12 is a schematic cross-sectional view of a display panel 10-3 according to an embodiment.

The display panel 10-3 of FIG. 12 may include a planarization organic layer 420 located on the thin film encapsulation layer 300 and in the middle area MA. The structure from the substrate 100 to the thin film encapsulation layer 300 is the same as that described above with reference to FIGS. 8 through 9F.

The planarization organic layer 420 may be arranged only in the middle area MA. The planarization organic layer 420 may be an organic insulating layer. The planarization organic layer 420 may include a polymer-based material. For example, the planarization organic layer 420 may include a silicon-based resin, an acrylic resin, an epoxy-based resin, polyimide, and polyethylene or the like. According to some example embodiments, the planarization organic layer 420 may include a different material from the organic encapsulation layer 320.

The planarization organic layer 420 may cover at least one groove G located in the middle area MA. The planarization organic layer 420 may cover an area that is not covered by the organic encapsulation layer 320 in the middle area MA, thereby increasing flatness of the display panel 10-3 around the first area OA. Accordingly, the input sensing layer 40 (FIG. 2 or FIG. 3) located on the display panel 10-2 or/and the optical functional layer 50 (FIG. 2 or FIG. 3) may be prevented from being separated or coming off. A portion of the planarization organic layer 420 may overlap the organic encapsulation layer 320. One end of the planarization organic layer 420, for example, a first end 420e adjacent to the display area DA may be located on the organic encapsulation layer 320.

The planarization organic layer 420 may be formed on the middle area MA by using an exposure and development process or the like. In some of the processes of forming the planarization organic layer 420 (for example, a cleaning process), when foreign substances, for example, when moisture proceeds in a lateral direction of the display panel 10-3 (or a direction parallel to an upper surface of a substrate, x-direction), the organic light-emitting diode OLED in the display area DA may be damaged. However, according to the embodiments, an insulating layer is arranged each under and over the planarization organic layer 420, for example, the first insulating layer 410 and the second insulating layer 430, and thus, the above-described problem due to moisture permeation and/or coming off of layers around the planarization organic layer 420 in an operation of forming the planarization organic layer 420 and in other subsequent processes may be prevented.

The first insulating layer 410 and the second insulating layer 430 may be in direct contact with a lower surface and an upper surface of the planarization organic layer 420, respectively. The first insulating layer 410 and the second insulating layer 430 may include an inorganic insulation material such as silicon oxide, silicon nitride, or silicon oxynitride. The first insulating layer 410 and the second insulating layer 430 may each include a single layer or a multi-layer including the above-described material.

The planarization organic layer 420 may form a step with the layer(s) under the planarization organic layer 420. For example, a portion of the planarization organic layer 420 including the first end 420e may form a step with the upper surface of the first insulating layer 410. In an operation of manufacturing the display panel 10-3 or/and after the manufacture, to prevent the planarization organic layer 420 from being separated or prevent floating of the planarization organic layer 420 from the layers thereunder due to the step difference, a cover layer 440 may be located over the first end 420e.

The cover layer 440 may include a metal. The first insulating layer 410, the second insulating layer 430, and a third insulating layer 450 which will be described later extend not only to the middle area MA but also onto the display area DA, whereas the cover layer 440 having a certain width may cover the first end 420e of the planarization organic layer 420. The cover layer 440 on the planarization organic layer 420 may extend beyond the first end 420e of the planarization organic layer 420 and extend toward the display area DA by a certain width.

The third insulating layer 450 may be located on the cover layer 440. The third insulating layer 450 may include an organic insulating material. For example, the third insulating layer 450 may include an organic insulating material which is a photoresist (negative or positive) or a polymer-based organic material, and may extend to the display area DA to cover the display area DA.

The structure described with reference to FIG. 12 may also apply to the embodiment described with reference to FIG. 11 and other embodiments derived therefrom.

The display panel 10-1 described with reference to FIGS. 8 through 12 includes a through hole 10H corresponding to the first area OA, and the substrate 100 also includes a through hole corresponding to the first area OA, but the embodiments are not limited thereto. According to some example embodiments, as described above with reference to FIG. 4B or the like, the display panel may not have a hole passing through the substrate 100.

In the display panel according to the embodiments, damage to display elements by external impurities such as moisture around the first area may be prevented. However, the effects as described above are example, and effects according to embodiments will be described in detail based on the description provided below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A display panel comprising:
   a substrate including a top surface and a bottom surface, the substrate having a through hole passing from the top surface to the bottom surface;
   a first transistor in a display area and electrically connected to a scan line and a data line;
   a second transistor in the display area and electrically connected the first transistor;
   an organic insulating layer in the display area and a non-display area between the display area and the through hole, wherein the organic insulating layer includes a groove in the non-display area;
   a light-emitting diode in the display area, the light-emitting diode comprising a pixel electrode on the organic insulating layer, an opposite electrode on the pixel electrode, and an intermediate layer between the pixel electrode and the opposite electrode; and
   a metal layer in the non-display area, wherein the metal layer is on the organic insulating layer and comprises a tip protruding toward a center of the groove,
   wherein the opposite electrode or at least one organic material layer of the intermediate layer is separated to a plurality of portions by the tip of the metal layer, and one of the plurality of portions is on the metal layer and an other of the plurality of portions is in the groove, and
   wherein the organic insulating layer is interposed between the first and second transistor and the pixel electrode of the light-emitting diode in the display area.

2. The display panel of claim 1, further comprising:
   a first inorganic encapsulation layer;
   a second inorganic encapsulation layer; and
   an organic encapsulation layer between the first inorganic encapsulation layer and the second inorganic encapsulation layer,
   wherein:
   each of the first and second inorganic encapsulation layers is in the display area and in the non-display area, and
   an edge of the first inorganic encapsulation layer and an edge of second inorganic encapsulation layer extend toward the through hole beyond an edge of the organic encapsulation layer.

3. The display panel of claim 2, wherein the other of the plurality of portions of the opposite electrode or at least one organic material layer, which is in the groove, is overlapped by a portion of the organic encapsulation layer.

4. The display panel of claim 2, further comprising a planarization organic layer on the second inorganic encapsulation layer.

5. The display panel of claim 4, wherein the other of the plurality of portions of the opposite electrode or at least one organic material layer, which is in the groove, is overlapped by a portion of the planarization organic layer and a direct-contact region between the first and second inorganic encapsulation layers.

6. The display panel of claim 1, further comprising a first metal layer overlapped with the metal layer.

7. The display panel of claim 6, wherein the organic insulating layer has an opening in the non-display area, and wherein the metal layer contacts the first metal layer via the opening of the organic insulating layer.

8. The display panel of claim 6, further comprising:
   a second metal layer under the first metal layer in the non-display area; and
   an interlayer insulating layer between the first metal layer and the second metal layer,
   wherein the metal layer overlaps the first and second metal layers.

9. The display panel of claim 8, wherein the interlayer insulating layer has an opening overlapped by the groove of the organic insulating layer.

10. An electronic device comprising:
    a display panel including an transmission area, a display area, and a non-display area between the transmission area and the display area; and
    a component corresponding to the transmission area,
    wherein the display panel comprises:
    a substrate including a top surface and a bottom surface, the substrate having a through hole passing from the top surface to the bottom surface, wherein the through hole corresponds to the transmission area;
    a first transistor in the display area and electrically connected to a scan line and a data line;
    a second transistor in the display area and electrically connected the first transistor;
    an organic insulating layer in the display area and the non-display area, wherein the organic insulating layer includes a groove in the non-display area;
    a light-emitting diode in the display area, the light-emitting diode comprising a pixel electrode on the organic insulating layer, an opposite electrode on the pixel electrode, and an intermediate layer between the pixel electrode and the opposite electrode; and
    a metal layer in the non-display area, wherein the metal layer is on the organic insulating layer and comprises a tip protruding toward a center of the groove,
    wherein the opposite electrode or at least one organic material layer of the intermediate layer is separated to a plurality of portions by the tip of the metal layer, and one of the plurality of portions is on the metal layer and an other of the plurality of portions is in the groove, and wherein the organic insulating layer is interposed between the first and second transistor and the pixel electrode of the light-emitting diode in the display area.

11. The electronic device of claim 10, wherein the display panel further comprises:
   a first inorganic encapsulation layer;
   a second inorganic encapsulation layer; and
   an organic encapsulation layer between the first inorganic encapsulation layer and the second inorganic encapsulation layer,
   wherein:
   each of the first and second inorganic encapsulation layers is in the display area and in the non-display area, and
   an edge of the first inorganic encapsulation layer and an edge of second inorganic encapsulation layer extend toward the through hole beyond an edge of the organic encapsulation layer.

12. The electronic device of claim 11, wherein the other of the plurality of portions of the opposite electrode or at least one organic material layer, which is in the groove, is overlapped by a portion of the organic encapsulation layer.

13. The electronic device of claim 11, wherein the display panel further comprises a planarization organic layer on the second inorganic encapsulation layer.

14. The electronic device of claim 13, wherein the other of the plurality of portions of the opposite electrode or at least one organic material layer, which is in the groove, is overlapped by a portion of the planarization organic layer and a direct-contact region between the first and second inorganic encapsulation layers.

15. The electronic device of claim 10, wherein the display panel further comprises a first metal layer overlapped with the metal layer.

16. The electronic device of claim 15, wherein the organic insulating layer has an opening in the non-display area, and wherein the metal layer contacts the first metal layer via the opening of the organic insulating layer.

17. The electronic device of claim 15, wherein the display panel further comprises:
   a second metal layer under the first metal layer in the non-display area; and
   an interlayer insulating layer between the first metal layer and the second metal layer,
   wherein the metal layer overlaps the first and second metal layers.

18. The electronic device of claim 17, wherein the interlayer insulating layer has an opening overlapped by the groove of the organic insulating layer.

19. The electronic device of claim 10, wherein the component comprises a sensor or a camera.

* * * * *